United States Patent [19]

Sauer et al.

[11] Patent Number: 5,610,560
[45] Date of Patent: Mar. 11, 1997

[54] OSCILLATOR WITH SWITCHED REACTIVE ELEMENTS

[75] Inventors: Donald J. Sauer, Allentown; William E. Rodda, Trenton; Edward R. Campbell, III, Tabernacle, all of N.J.

[73] Assignee: RCA Thomson Licensing Corporation, Princeton, N.J.

[21] Appl. No.: 525,684

[22] PCT Filed: Apr. 19, 1994

[86] PCT No.: PCT/US94/04404

§ 371 Date: Dec. 11, 1995

§ 102(e) Date: Dec. 11, 1995

[87] PCT Pub. No.: WO94/24767

PCT Pub. Date: Oct. 27, 1994

[30] Foreign Application Priority Data

Apr. 20, 1993 [GB] United Kingdom .................... 9308141
Jun. 4, 1993 [GB] United Kingdom .................... 9311560

[51] Int. Cl.[6] ................... H03B 5/24; H03L 7/099
[52] U.S. Cl. .................... 331/8; 331/11; 331/14; 331/36 R; 331/137; 331/179
[58] Field of Search ..................... 331/34, 36 R, 331/57, 111, 135, 137, 143, 177 R, 179, 8, 10, 14, 11

[56] References Cited

U.S. PATENT DOCUMENTS

| 4,484,152 | 11/1984 | Lee | 331/1 A |
|---|---|---|---|
| 4,514,705 | 4/1985 | Harzer | 331/2 |
| 4,516,118 | 5/1985 | Wahlquist | 340/703 |
| 4,580,107 | 4/1986 | Caldwell et al. | 331/10 |
| 4,594,564 | 6/1986 | Yarborough, Jr. | 331/1 A |
| 4,616,259 | 10/1986 | Moran et al. | 358/148 |
| 4,654,604 | 3/1987 | Smith et al. | 331/1 A |
| 4,745,372 | 5/1988 | Miwa | 331/8 |
| 4,797,634 | 1/1989 | Filliman | 331/12 |
| 4,812,783 | 3/1989 | Honjo et al. | 331/20 |
| 4,827,225 | 5/1989 | Lee | 331/10 |
| 4,837,781 | 6/1989 | Hickling | 375/81 |
| 4,843,332 | 6/1989 | Cok et al. | 328/133 |
| 4,878,231 | 10/1989 | Cok | 375/80 |
| 4,881,048 | 11/1989 | Auneau et al. | 331/14 |
| 4,890,071 | 12/1989 | Curtis | 331/11 |
| 4,918,405 | 4/1990 | Herleikson | 331/11 |
| 4,920,320 | 4/1990 | Matthews | 328/155 |
| 4,920,322 | 4/1990 | Ruijs | 331/17 |
| 4,935,706 | 6/1990 | Schenberg | 331/11 |
| 4,974,081 | 11/1990 | Yokogawa | 358/148 |
| 5,053,723 | 10/1991 | Schemmel | 331/179 |
| 5,157,355 | 10/1992 | Shikakura et al. | 331/11 |
| 5,159,292 | 10/1992 | Canfield et al. | 331/1 A |
| 5,162,910 | 11/1992 | Willis | 358/158 |
| 5,172,076 | 12/1992 | Brown | 331/57 |
| 5,180,995 | 1/1993 | Hayashi et al. | 331/57 |
| 5,191,301 | 3/1993 | Mullgrav, Jr. | 331/57 |
| 5,239,274 | 8/1993 | Chi | 331/57 |
| 5,298,870 | 3/1994 | Cytera et al. | 331/45 |

FOREIGN PATENT DOCUMENTS

| 0316607 | 5/1989 | European Pat. Off. . |
| 0426900 | 5/1991 | European Pat. Off. . |
| 2290782 | 6/1976 | France . |
| WO89/06456 | 7/1989 | WIPO . |

OTHER PUBLICATIONS

International Conference on EC-3-Energy Computer, Communication and Control Systems, vol. 3, 28 Aug. 1991, New Dehli, pp. 221–226, R. Pal et al "Frequency Tuning of Bipolar Ring Oscillators".

1991 IEEE International Solid-State Circuits Conference, vol. 34, 1 Feb. 1991, New York US, pp. 144–145, B. Lai et al, "A Monolithic 622MB/S Clock Extraction Data Retiming Circuit".

Telecommunications and Radio Engineering, vol. 40/41, No. 9, 1 Sep. 1986, Silver Springs US, pp. 105–109, V. Arutyunyan et al "Multichannel Generators of Shifted Square Pulses with RC Integrating Circuits".

Primary Examiner—Siegfried H. Grimm
Attorney, Agent, or Firm—Joseph S. Tripoli; Joseph J. Laks; Sammy S. Henig

[57] ABSTRACT

A phase-locked-loop circuit includes an oscillator having switched capacitors that are selectively coupled to a positive feedback path of the oscillator in a coarse frequency error correction mode of operation. When the frequency error is small, the circuit operates in a fine error correction mode without varying the selection of the switched reactive elements.

21 Claims, 16 Drawing Sheets

| CFRL(4:0) | | CF(31:28) | CF(27:24) | CF(23:20) | CF(19:16) | CF(15:12) | CF(11:8) | CF(7:4) | CF(3:0) |
|---|---|---|---|---|---|---|---|---|---|
| 0  | 00000 | 0000 | 0000 | 0000 | 0000 | 0000 | 0000 | 0000 | 0000 |
| 1  | 00001 | 0000 | 0000 | 0000 | 0000 | 0000 | 0000 | 0000 | 0001 |
| 2  | 00010 | 0000 | 0000 | 0000 | 0000 | 0000 | 0000 | 0000 | 0011 |
| 3  | 00011 | 0000 | 0000 | 0000 | 0000 | 0000 | 0000 | 0000 | 0111 |
| 4  | 00100 | 0000 | 0000 | 0000 | 0000 | 0000 | 0000 | 0000 | 1111 |
| 5  | 00101 | 0000 | 0000 | 0000 | 0000 | 0000 | 0000 | 0001 | 1111 |
| 6  | 00110 | 0000 | 0000 | 0000 | 0000 | 0000 | 0000 | 0011 | 1111 |
| 7  | 00111 | 0000 | 0000 | 0000 | 0000 | 0000 | 0000 | 0111 | 1111 |
| 8  | 01000 | 0000 | 0000 | 0000 | 0000 | 0000 | 0000 | 1111 | 1111 |
| 9  | 01001 | 0000 | 0000 | 0000 | 0000 | 0000 | 0001 | 1111 | 1111 |
| 10 | 01010 | 0000 | 0000 | 0000 | 0000 | 0000 | 0011 | 1111 | 1111 |
| 11 | 01011 | 0000 | 0000 | 0000 | 0000 | 0000 | 0111 | 1111 | 1111 |
| 12 | 01100 | 0000 | 0000 | 0000 | 0000 | 0000 | 1111 | 1111 | 1111 |
| 13 | 01101 | 0000 | 0000 | 0000 | 0000 | 0001 | 1111 | 1111 | 1111 |
| 14 | 01110 | 0000 | 0000 | 0000 | 0000 | 0011 | 1111 | 1111 | 1111 |
| 15 | 01111 | 0000 | 0000 | 0000 | 0000 | 0111 | 1111 | 1111 | 1111 |
| 16 | 10000 | 0000 | 0000 | 0000 | 0000 | 1111 | 1111 | 1111 | 1111 |
| 17 | 10001 | 0000 | 0000 | 0000 | 0001 | 1111 | 1111 | 1111 | 1111 |
| 18 | 10010 | 0000 | 0000 | 0000 | 0011 | 1111 | 1111 | 1111 | 1111 |
| 19 | 10011 | 0000 | 0000 | 0000 | 0111 | 1111 | 1111 | 1111 | 1111 |
| 20 | 10100 | 0000 | 0000 | 0000 | 1111 | 1111 | 1111 | 1111 | 1111 |
| 21 | 10101 | 0000 | 0000 | 0001 | 1111 | 1111 | 1111 | 1111 | 1111 |
| 22 | 10110 | 0000 | 0000 | 0011 | 1111 | 1111 | 1111 | 1111 | 1111 |
| 23 | 10111 | 0000 | 0000 | 0111 | 1111 | 1111 | 1111 | 1111 | 1111 |
| 24 | 11000 | 0000 | 0000 | 1111 | 1111 | 1111 | 1111 | 1111 | 1111 |
| 25 | 11001 | 0000 | 0001 | 1111 | 1111 | 1111 | 1111 | 1111 | 1111 |
| 26 | 11010 | 0000 | 0011 | 1111 | 1111 | 1111 | 1111 | 1111 | 1111 |
| 27 | 11011 | 0000 | 0111 | 1111 | 1111 | 1111 | 1111 | 1111 | 1111 |
| 28 | 11100 | 0000 | 1111 | 1111 | 1111 | 1111 | 1111 | 1111 | 1111 |
| 29 | 11101 | 0001 | 1111 | 1111 | 1111 | 1111 | 1111 | 1111 | 1111 |
| 30 | 11110 | 0011 | 1111 | 1111 | 1111 | 1111 | 1111 | 1111 | 1111 |
| 31 | 11111 | 0111 | 1111 | 1111 | 1111 | 1111 | 1111 | 1111 | 1111 |

FIG. 8

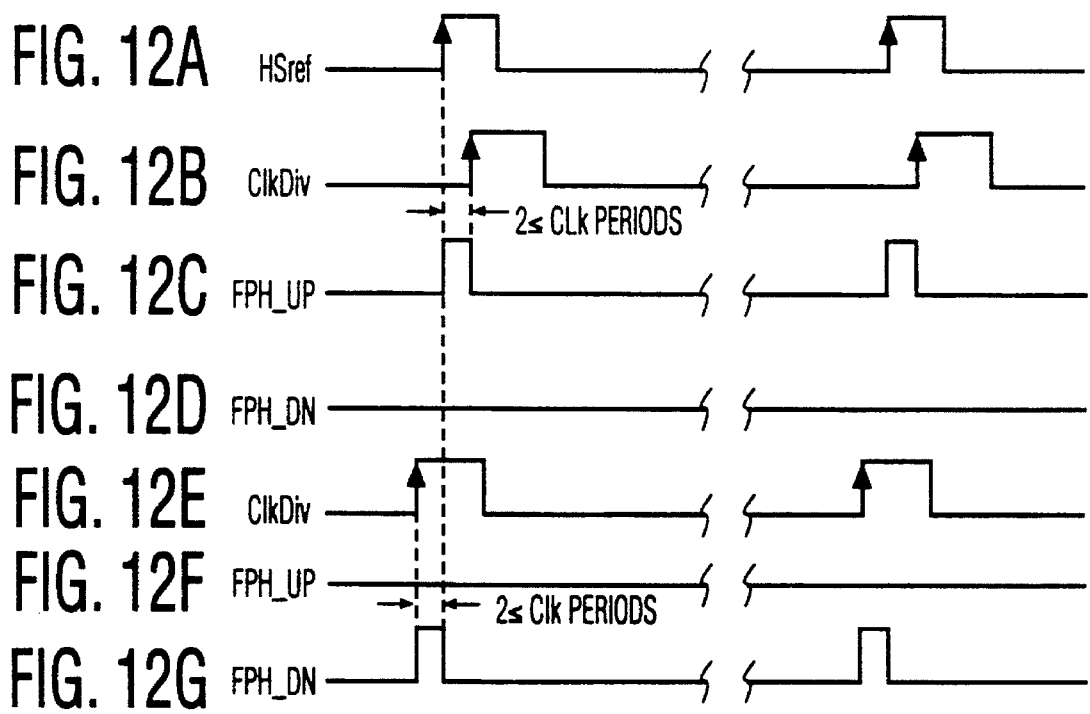

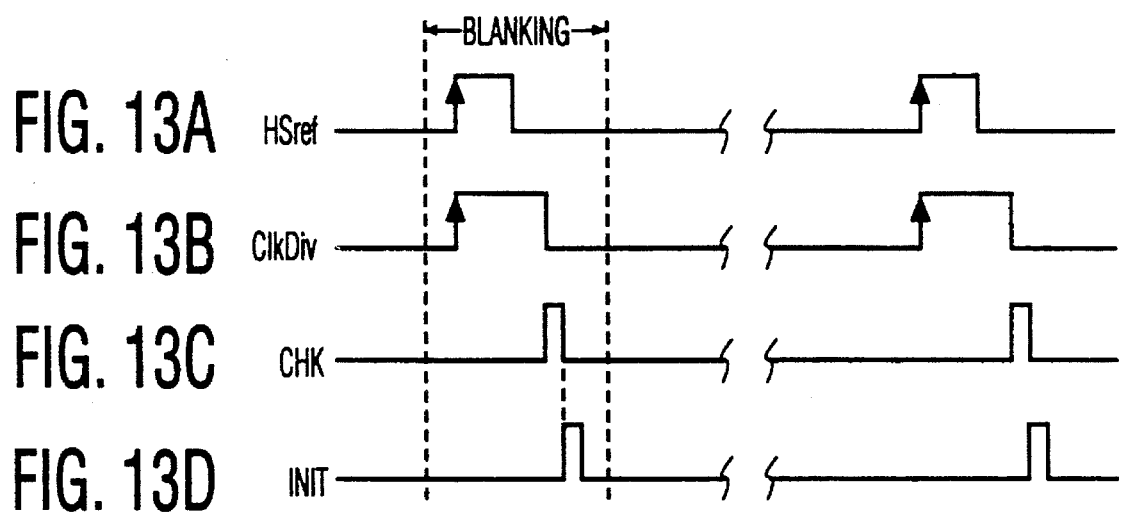

OSCILLATOR WITH SWITCHED REACTIVE ELEMENTS

The invention relates to an arrangement for generating a clock signal.

Digital video signal processing systems with features such as on-screen display of text and picture-in-picture for both television receiver and video tape recorder signal sources may require a clock signal that is phase locked to a horizontal synchronization signal, referred to as line-locked clock. It may be advantageous to form a phase-locked loop (PLL) system for line-locked clock generation for use as a building block in large scale CMOS video signal processing integrated circuits. In such PLL, it may be desirable to have, for example, a clock frequency that ranges from 25 MHz to 40 MHz with a jitter that is less than 2 nS. For such PLL it may be desirable to utilize only one pin for off-chip components. It may also be desirable to use the PLL system with each of the NTSC, PAL and SECAM systems.

It may further be advantageous to operate the PLL with input sync signal encountered in low-cost consumer video tape recorders without time-base correction where the horizontal sync can periodically make large phase changes such that the clock signal tracks such sync signal. It may be further desirable to rapidly reduce phase and frequency errors and minimize overshoot and jitter as the PLL settles into phase lock. In addition, it may be desirable to have the PLL discriminate between true output clock phase/frequency errors and those arising from contamination of the input horizontal sync signal with noise bursts or occasional missing pulses.

A PLL system, embodying an inventive feature, utilizes both digital and analog control of an R-C Voltage-Controlled Oscillator to acquire and maintain phase lock of an output clock with respect to an input horizontal sync signal. Depending on the magnitude and consistency of the output clock phase and frequency error, the system automatically selects one of, for example, five control modes of operation of varying sensitivity. The control modes of operation are such that large errors result in large, coarse corrective actions, and small errors result in small, or fine corrective actions.

In a PLL, embodying a different inventive feature, a frequency of an output signal of an oscillator is controlled in accordance with switched capacitors that are selectively coupled to a positive feedback path of the oscillator. A given group of switched capacitors selects a corresponding frequency range portion selected from an entire range of frequencies of the oscillator output signal. By varying the selection of the switched capacitors, the frequency range portion of the frequencies of the oscillator varies. Within the given frequency range portion, the frequency of the oscillator output signal is controllable by a control signal without varying the selection of the switched capacitors. The control signal can vary the oscillator frequency only within a limited portion of the entire range of frequencies. Therefore, stability and noise immunity is increased. Advantageously, jitter of the output signal of the oscillator is also reduced. Consequently, the oscillator can be realized with capacitors that can be fabricated within an integrated circuit. The integrated circuit may also include the remaining active circuit elements of the oscillator. When a large frequency error occurs between the horizontal synchronization signal and an output signal of the oscillator, the PLL operates in a coarse frequency correction mode.

In accordance with a further inventive feature, in each capacitor switching step that occurs in a sequential manner, a predetermined pair of the switched capacitors are either both coupled to the positive feedback path or both decoupled from the positive feedback path, in accordance with the direction of the frequency error. The frequency of the oscillator output signal changes progressively in the same direction, or monotoneously, in each switching step in the sequence of steps until the frequency error changes direction. When the frequency error changes direction, operation in the coarse frequency correction mode ceases and any remaining frequency error is relatively small. Advantageously, monotonically changing the frequency of the oscillator output signal simplifies the control of the PLL because in each step the direction of the change of the frequency is not dependent on tolerances of, for example, the capacitors.

An apparatus, embodying an additional inventive feature, for generating an oscillatory signal that is locked to an input signal, includes an amplifier. A plurality of switched reactive elements selectively coupled in a positive feedback path formed between an output and an input of the amplifier are provided. The oscillatory signal has a frequency that is selected from a corresponding portion of a range of frequencies in accordance with a selection of the switched reactive elements. A frequency error is measured between the oscillatory and input signals. A first switching control signal that is coupled to a switching arrangement associated with the switched reactive elements is generated to select the switched reactive elements in accordance with the frequency error. When the frequency error exceeds a first value, the selection of the switched reactive element varies in switching steps of a coarse frequency correction mode of operation to reduce the frequency error progressively in successive switching steps. A second control signal that is coupled to a control input of the amplifier is generated for varying the frequency of the oscillatory signal within the corresponding portion of the range. The frequency error is corrected in a fine error correction mode of operation when the frequency error does not exceed the first value, without varying the selection of the switched reactive elements.

FIG. 8 is a table useful for explaining the operation of a decoder of FIG. 1;

FIGS. 12A–12G illustrate waveforms useful for explaining the operation of the phase detector of FIG. 11; and FIGS. 13A–13D illustrate waveforms useful for explaining the operation of the charge pump stage of the PLL of FIG. 1.

Figure 1:
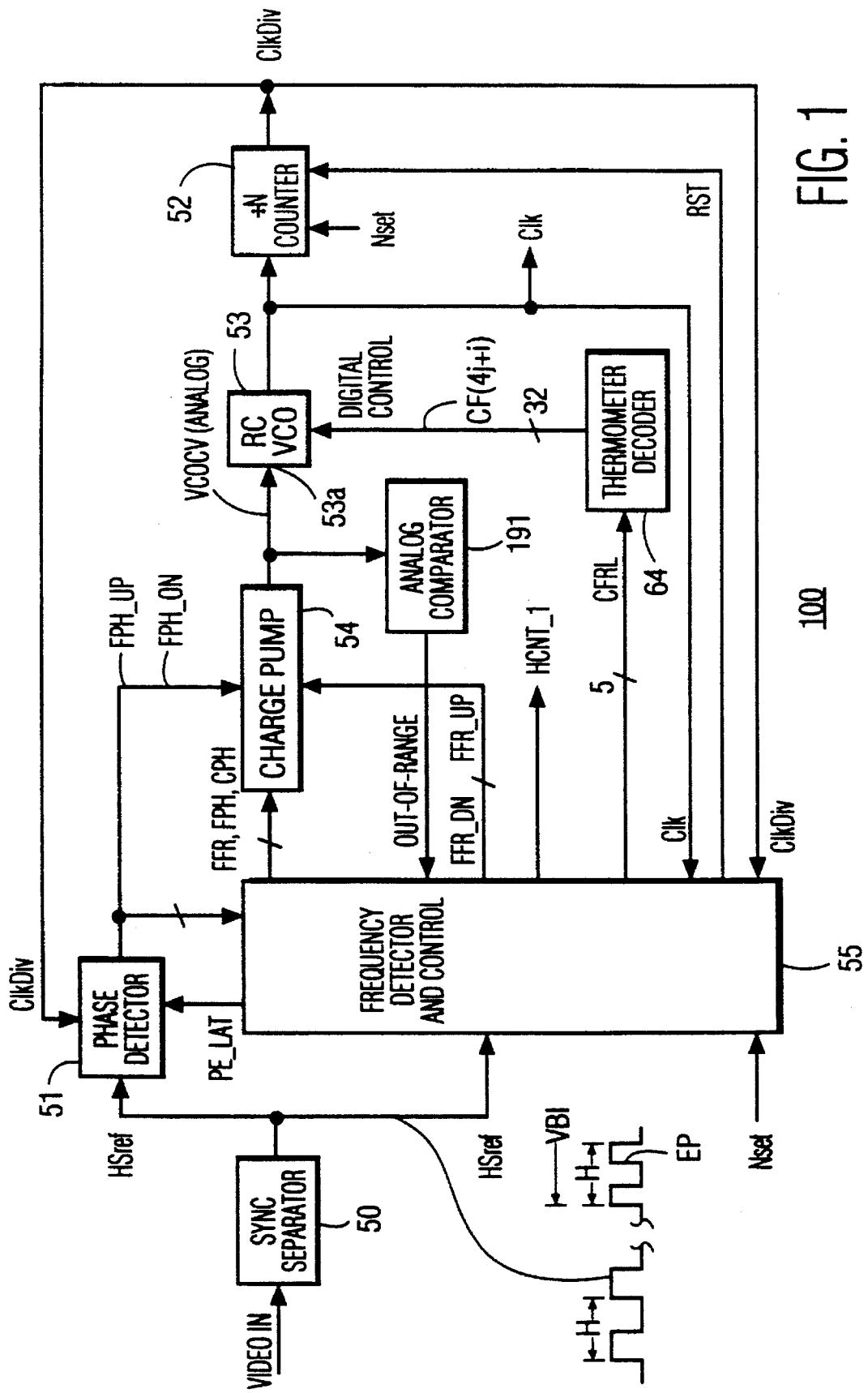
FIG. 1 illustrates a block diagram of a phase-lock-loop (PLL), embodying an aspect of the invention.

FIG. 1 illustrates a block diagram of a phase-lock loop circuit (PLL) 100, embodying an aspect of the invention. A base band video signal VIDEO-IN obtained from, for example, a video detector, not shown, of a television receiver is coupled to a conventional sync separator 50 that generates pulses of a horizontal sync signal HSRef having a period H at a horizontal deflection frequency $f_H$ that is in, for example, the NTSC standard 15,734 Hz.

An oscillatory signal ClkDiv is produced at an output of a programmable divide-by-N counter 52 by frequency dividing an output signal Clk of PLL 100 produced in a programmable, resistor-capacitor (R-C) type voltage-controlled-oscillator (RCVCO) 53. Output signal Clk may be used in various stages, not shown, of the television receiver for video signal processing. In steady state operation, the frequency of signal Clk is equal to $N \times f_H$. The value N denotes a ratio between the frequency of signal Clk and that of signal ClkDiv. The value N that is selectable in the range of 750–2600 is provided by a constant digital word signal Nset that is coupled to counter 52 for presetting counter 52 once in each period of signal ClkDiv.

Figure 2A:
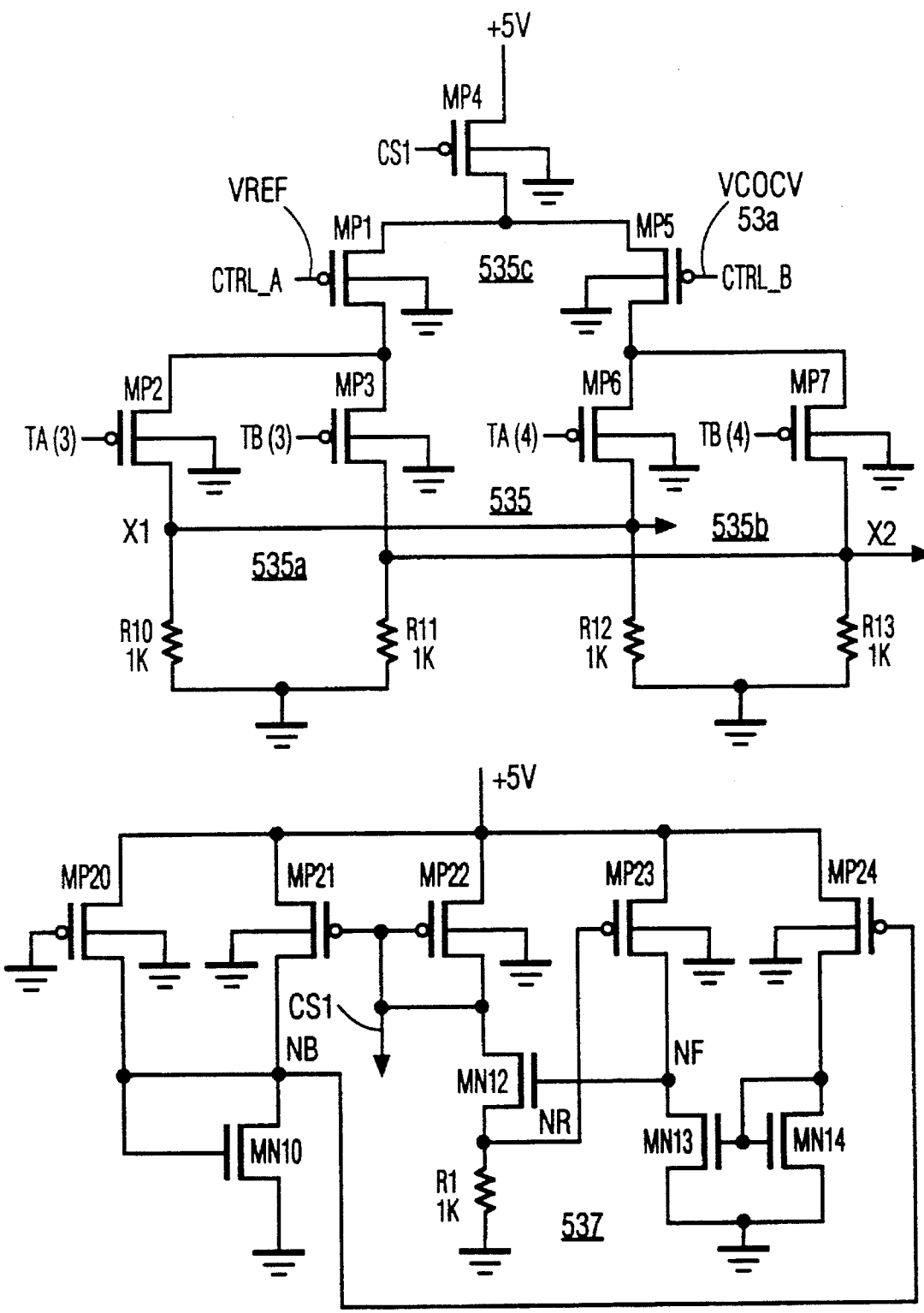
FIGS. 2A, 2B and 2C illustrate a detailed schematic diagram of a programmable switched R-C voltage controlled oscillator of the PLL of FIG. 1.
Figure 2B:
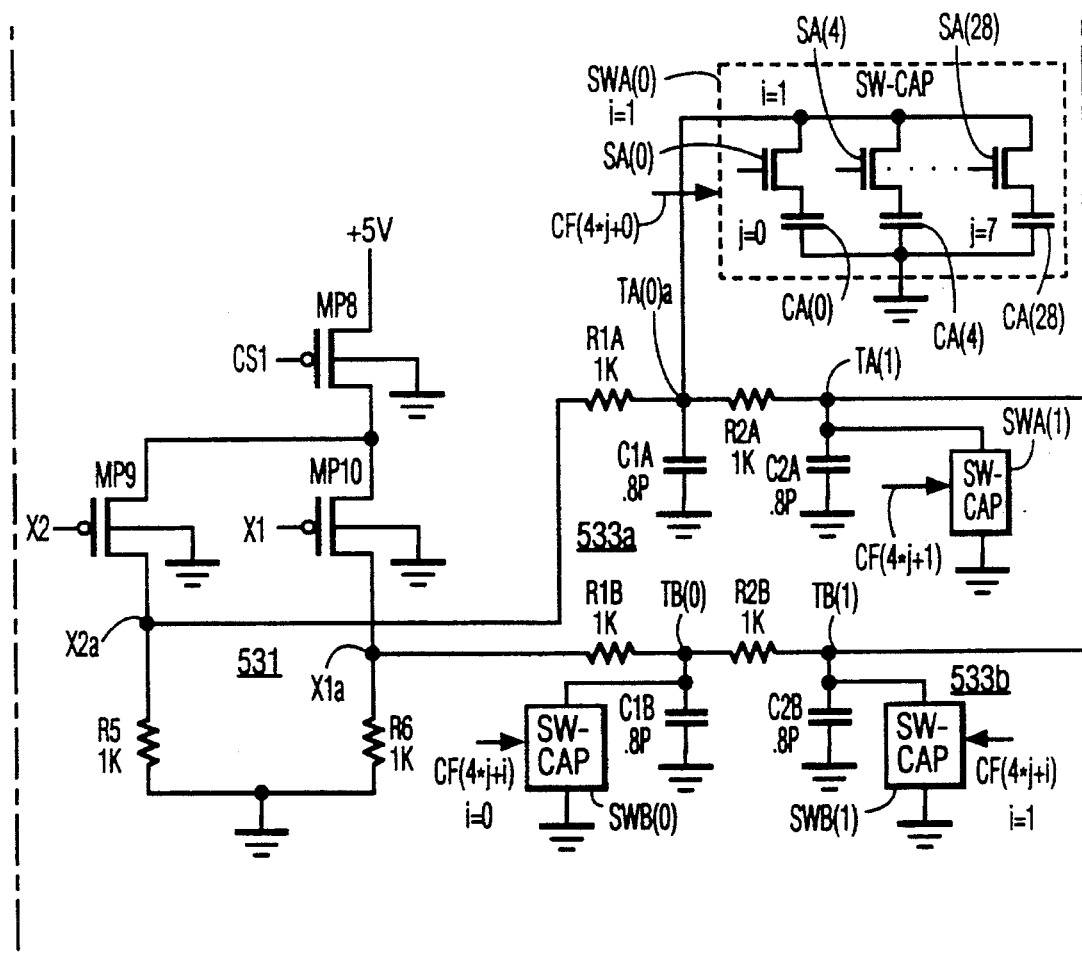
Figure 2C:
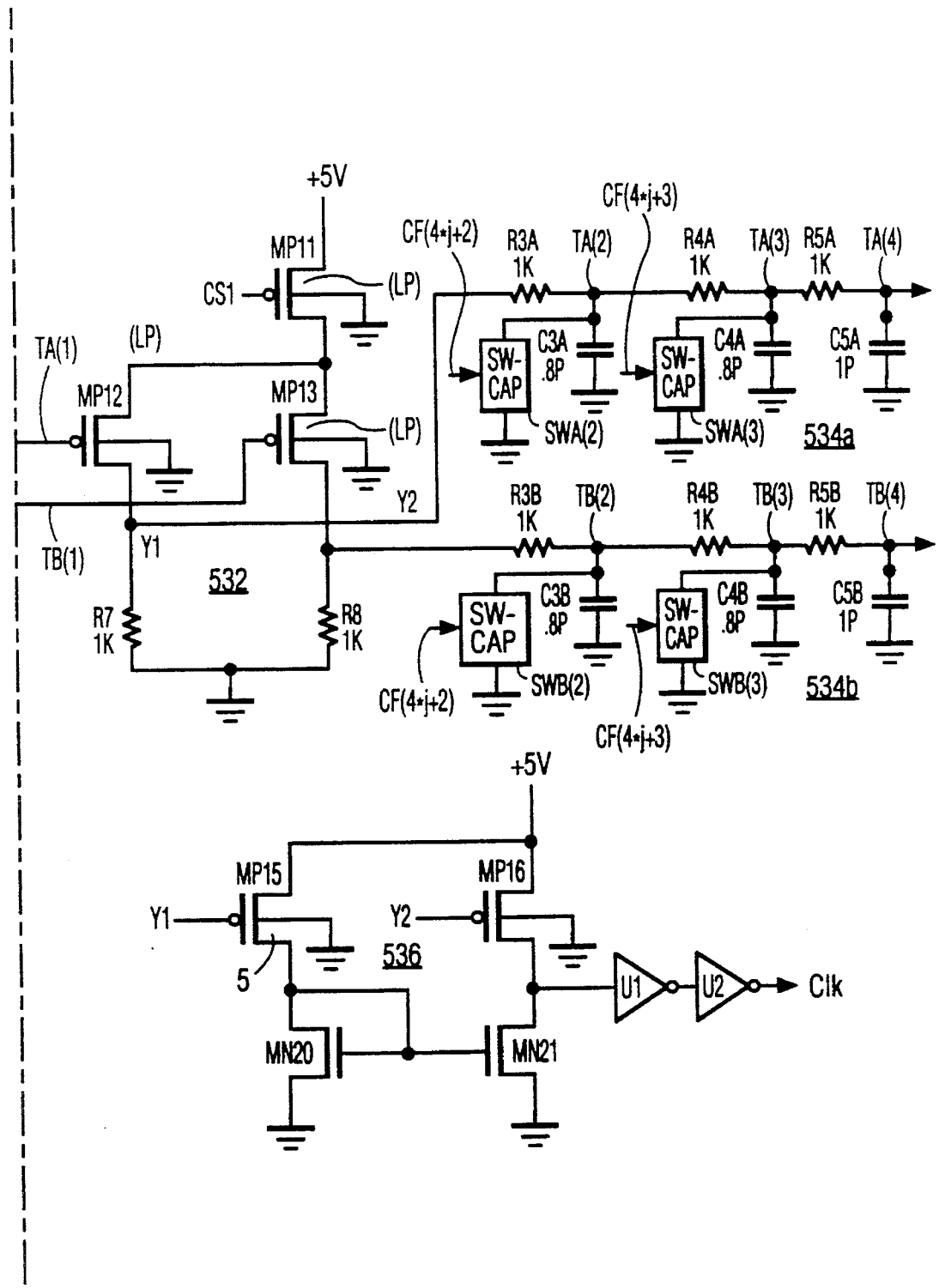

FIGS. 2A, 2B and 2C illustrate a schematic diagram of RCVCO 53 of FIG. 1. Similar symbols and numerals in FIGS. 1 and 2A–2C indicate similar items or functions. RCVCO 53 of FIG. 2B includes a differential amplifier 531 formed by a pair of transistors MP9 and MP10. A current source transistor MP8 produces a corresponding source electrode current in each of transistors MP9 and MP10. Amplifier 531 includes load resistors R5 and R6 of transistors MP9 and MP10, respectively. Similarly, a differential amplifier 532 of FIG. 2C is formed by transistors MP11, MP12 and MP13 and load resistors R7 and R8. A pair of signals X2a and X1a developed in load resistors R5 and R6 of amplifier 531 are coupled to gate electrodes of transistors MP12 and MP13 via a pair of R-C delay networks 533a and 533b, respectively, that produce nominally the same phase shift. The phase shift produced by network 533a or 533b is controllable in a coarse frequency correction mode of operation, as explained later on. The phase shift determines, in part, the frequency of oscillation of signal Clk.

Delay network 533a includes a resistor R1A and a non-switched capacitor C1A. A switched capacitor bank SWA(0) is also coupled to capacitor C1A. A delayed signal TA(0) is developed at a junction terminal TA(0)a, between capacitor C1A and resistor R1A. Signal TA(0) is coupled via a resistor R2A to a capacitor C2A. A switched capacitor bank SWA(1) is also coupled to capacitor C2A. A delayed signal TA(1) is developed in capacitor C2A. Signal TA(1) is delayed with respect to signal TA(0). Similarly, network 533b includes a resistor R1B, a capacitor C1B and a bank SWB(0) that produces a signal TB(0). Network 533b includes a resistor R2B, a capacitor C2B and a bank SWB(1) that produces a signal TB(1).

A pair of signals Y1 and Y2 of FIG. 2C developed in load resistors R7 and R8, respectively, of amplifier 532 are coupled via R-C delay networks 534a and 534b, respectively, that produce nominally the same phase shift. Networks 534a and 534b operate in a similar manner to networks 533a and 533b. Network 534a includes a resistor R3A, a capacitor C3A and a bank SWA(2) that produces a delayed signal TA(2). Signal TA(2) is coupled via a resistor R4A to a capacitor C4A and to a bank SWA(3) that produces a delayed signal TA(3). Signal TA(3) is further delayed via a resistor R5A and a capacitor C5A to produce a further delayed signal TA(4). Similarly, delay network 534b includes resistors R3B, R4B and R5B that are analogous to resistors R3A, R4A and R5A, respectively, and capacitors C3B, C4B and C5B that are analogous to capacitors C3A, C4A and C5A, respectively. Network 534b produces delayed signals TB(2), TB(3) and TB(4) that are analogous to signals TA(2), TA(3) and TA(4), respectively.

Signals TB(3) and TA(3) are coupled to gate electrodes of a pair of transistors MP3 and MP2, respectively, of an analog multiplier 535 of FIG. 2A. Similarly, signals TB(4) and TA(4), that are delayed with respect to signals TB(3) and TA(3), respectively, are coupled to gate electrodes of a pair of transistors MP7 and MP6, respectively, of multiplier 535 of FIG. 2A.

In multiplier 535, transistors MP2 and MP3 form a differential amplifier 535a having a controllable gain. Similarly, transistor MP6 and MP7 form a differential amplifier 535b having a controllable gain. The gains of amplifiers 535a and 535b vary in opposite directions in accordance with variations in drain currents produced by a pair of transistors MP1 and MP5 that form a differential amplifier 535c. The drain currents in transistors MP1 and MP2 vary in opposite directions in accordance with a voltage difference between gate electrodes of transistors MP1 and MP5.

A constant DC reference voltage VREF is developed at the gate of transistor MP1. A control, output signal VCOCV produced in a charge pump control stage 54 of FIG. 1 is developed at the gate of transistor MP5 of FIG. 2A to control the frequency/phase of signal Clk, in a fine error correction mode of operation, as explained later on.

The drain electrode of transistor MP2 is coupled to the drain electrode of transistor MP6 to develop a sum signal X1. Signal X1 is developed in a pair of parallel coupled load resistors R10 and R12 and is coupled to the gate electrode of transistor MP10 of amplifier 531 of FIG. 2B. Similarly, the drain electrode of transistors MP3 of FIG. 2A is coupled to the drain electrode of transistor MP7 to develop a sum signal X2. Signal X2 is developed in a pair of load resistors R11 and R13 and is coupled to the gate electrode of transistor MP9 of amplifier 531 of FIG. 2B.

The signal gain, for example, via transistor MP2 varies in the opposite way to that via transistor MP6. The phase shift of signal X1 is determined by the vectorial sum of a pair of signals having a phase difference therebetween produced from the drain currents in transistors MP2 and MP6, respectively. Thus, the phase shift of signal X1 varies in a fine or gradual manner when analog signal VCOCV that is coupled to amplifier 535c varies in a gradual manner. Similarly, the phase shift of signal X2 also varies in a fine or gradual manner in accordance with signal VCOCV. Signal X1 is nominally at an opposite phase with respect to signal X2. Varying the phase shift of signal X1 or X2 causes the oscillation frequency of RCVCO 53 and of signal Clk to vary, as explained later on.

It may be desirable to achieve a wide frequency range of, for example, 25–40 MHz of signal Clk and also to compensate for tolerances, temperature variations and for aging in the R-C delay networks. The R-C delay networks are formed in RCVCO 53 using integrating circuit fabrication technique.

The frequency of RCVCO 53 can be stepped up or down in a coarse frequency correction mode of operation. For example, the coarse frequency correction mode may occur immediately after power is applied. To provide the coarse frequency correction mode, the aforementioned four switch-capacitor banks, SWA(i), are provided. The parameter "i" that designates the switch-capacitor bank assumes the four values, 0 to 3. Switch-capacitor banks SWA(i) are coupled to four corresponding terminals where signals TA(i), referred to before, are developed. Thus, a given bank SWA(i) is coupled to a corresponding terminal where signal TA(i) is designated by the same value "i". Similarly, the afore-mentioned four switch-capacitor banks, SWB(i), are coupled to corresponding four terminals where signal TB(i), referred to before, are developed. In the same way, the parameter "i" assumes the values 0 to 3.

Each bank SWA(i), such as bank SWA(0) of FIG. 2B, includes eight parallel coupled switch-capacitor arrangements. A given switch-capacitor arrangement of a given bank SWA(i) is formed by a transistor switch SA(4j+i), shown in FIG. 3, that is coupled in series with a corresponding capacitor CA(4j+i). Similar symbols and numerals in FIGS. 1, 2A–2C and 3 indicate similar items or functions. For a given bank SWA(i) of FIGS. 2B and 2C, the parameter j assumes, selectively, one of the eight values 0 to 7.

Figure 3:
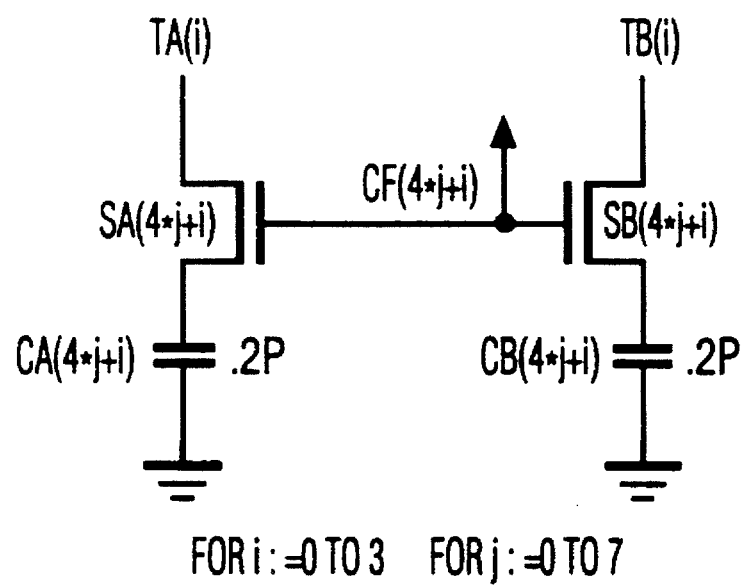
FIG. 3 illustrates a switched capacitor arrangement of the oscillator of FIGS. 2A–2C.

A given transistor switch SA(4j+i) of FIG. 3 is coupled in series with a corresponding capacitor CA(4j+i) such that the value of "i" is common to both switch SA(4j+i) and to capacitor C(4j+i) and the value of "j" is also common for both. Similarly, each bank SWB(i) of FIGS. 2B and 2C includes eight parallel coupled transistor switch-capacitor arrangements, such as, for example, bank SWA. Each of such eight arrangements is formed by a transistor switch SB(4j+i) of FIG. 3 that is coupled in series with a capacitor CB(4j+i).

In each pair of banks, SWA(i) and SWB(i), of FIGS. 2B and 2C designated by a common value "i", such as, for example, banks SWA(0) and SWB(0), eight control signals CF(4j+i) control the corresponding eight pairs of transistor switches SA(4j+i) and SB(4j+i) designated also by the common value of "i" and the common value of "j". Signals CF(4j+i) are developed in a manner that is described later on. Thus, the total of 32 pairs of switches SA(4j+i) and SB(4j+i) are controlled by the 32 control signals CF(4j+i), respectively. The value of "i" for a given pair of switches SA(4j+i) of FIG. 3 and SB(4j+i) and for control signal CF(4j+i) that controls such pair of switches is the same. The value of "j" is also common for the given pair of switches SA(4j+i) and SB(4j+i) and for control signal CF(4j+i) that controls such pair.

When a given control signal CF(4j+i) assumes a TRUE state, a corresponding capacitor CA(4j+i) of the corresponding bank SWA(i) and a corresponding capacitor CB(4j+i) of the corresponding bank SWB(i) are switched in or coupled via a pair of the switches SA(4j+i) and SB(4j+i) to the terminals where signals TA(i) and TB(i), respectively, are developed. Thereby, an increased phase delay and a corresponding decrease in the oscillation frequency of signal Clk of FIG. 2C occur. On the other hand, when a given control signal CF(4j+i) of FIG. 3 assumes a FALSE state, the corresponding pair of capacitors are switched out or decoupled, causing an increase in the oscillation frequency of signal Clk of FIG. 2C.

A current mirror reference circuit 537 of FIG. 2A includes a PMOS transistor MP20 that provides a small start-up current such as 1 μA. The start-up current causes a voltage level at a terminal NB to initially rise to a threshold voltage of a transistor MN10, typically 0.8 V. Voltages at a terminal NR and at terminal NB are compared in a balanced PMOS current mirror amplifier formed by transistors MP23, MP24, MN13 and MN14.

Negative feedback from a terminal NF is applied to the gate of a transistor MN12 forcing the voltages at terminals NR and NB to be equal. The current flowing in a resistor R1 is, therefore, proportional to the voltage at terminal NB. Once current starts flowing in resistor R1, in transistor MN12 and in transistor MP22, additional current is sourced into terminal NB which causes the voltage at terminal NB to rise to a level of about 1.5 V. Thus, a reference current flowing in transistor MP22 is nominally 0.25 mA.

An output voltage CS1 of current mirror reference circuit 537 developed at the drain of transistor MP22 is coupled to the gates of transistors MP4 and MP8 of FIG. 2B and transistor MP11 of FIG. 2C. As a result, the current flowing in transistor MP4 of FIG. 2A is nominally 3 mA and the current flowing in each of the amplifiers sourced by transistors MP8 and MP11 is 1.5 mA. Circuit 537 of FIG. 2A maintains stability of the frequency of the oscillator with respect to supply voltage change. Simulation shows that sensitivity to supply voltage change is 0.9%/V and to temperature change is −0.012%/°C.

RCVCO 53 of FIGS. 2A–2C is constructed in a differential symmetrical manner. Signals X2, Y1, TA(0), TA(1), TB(2), TB(3) and TB(4), defining a first positive feedback path, are differentially symmetrical with respect to signals X1, Y2, TB(0), TB(1), TA(2), TA(3) and TA(4), respectively, defining a second positive feedback signal path. Therefore, phase difference between a pair of differentially symmetrical signals such as, for example, signals Y1 and Y2 does not vary when the gain of, for example, amplifiers 535a and 535b of FIG. 2A varies or when a temperature variation occurs. RCVCO 53 oscillates at a frequency which is determined by the total phase shift in its pair positive feedback paths.

In accordance with an inventive feature, as explained before, a pair of capacitors CA(4j+i) and CB(4j+i) of FIGS. 2A–2C are switched in together or switched out together. Therefore, advantageously, the differential symmetrical configuration is not disturbed in each step of the coarse frequency error correction mode.

Figure 4:
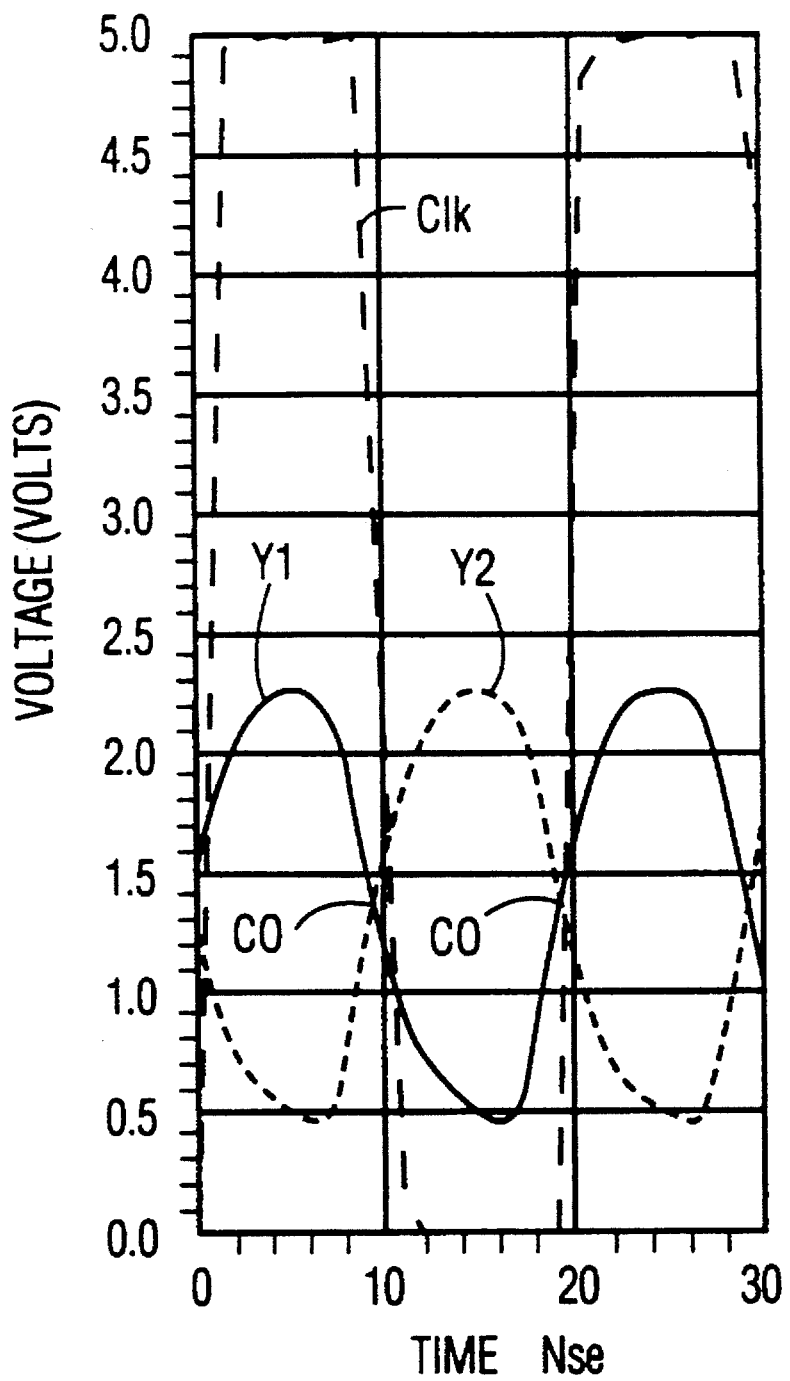
FIG. 4 illustrates waveforms useful for explaining the arrangement of FIGS. 2A–2C.

FIG. 4 illustrates an example of simulated waveforms of signals Y1 and Y2 of FIG. 1 when all the switched capacitors in RCVCO 53 are recoupled by signals CF(4j+i), resulting in maximum frequency or minimum period of signal Clk such as 19.62 nS. Similar symbols and numerals in FIGS. 1, 2A–2C, 3 and 4 indicate similar items or functions.

As shown in FIG. 4, signals Y1 and Y2 are nearly identical in magnitude and they are phased by 180 degrees with respect to each other. Signals Y1 and Y2 are differentially symmetrical signals because of the differential symmetrical configuration. Thus, crossover points in signals Y1 and Y2, such as points CO, that occur when the instantaneous values of signals Y1 and Y2 are simultaneously the same, occur at the opposite phase. Advantageously, the crossover points CO are nearly equally spaced in time as a result of the aforementioned differential symmetrical configuration. Because of the symmetrical configuration, the duty cycle of signal Clk is, advantageously, not affected by gain variations and temperature caused component variations. Therefore, advantageously, a relatively simple differential-to-single ended translation circuit 536 of FIG. 2C that receives signals Y1 and Y2 and is formed by transistors MP15, MP16, MN20 and MN21 and gates U1 and U2 generates signal Clk at approximately 50% duty cycle. Furthermore, the differential symmetry configuration provides improved common mode noise rejection.

The measured noise bandwidth of RCVCO 53 is −30 dB at 350 Hz. The short term stability of RCVCO 53 within 1 second is about ±150 Hz or 20 ppm, corresponding to a 1.3 ns jitter in one horizontal line period H of 63.5 μsec.

Figure 5:
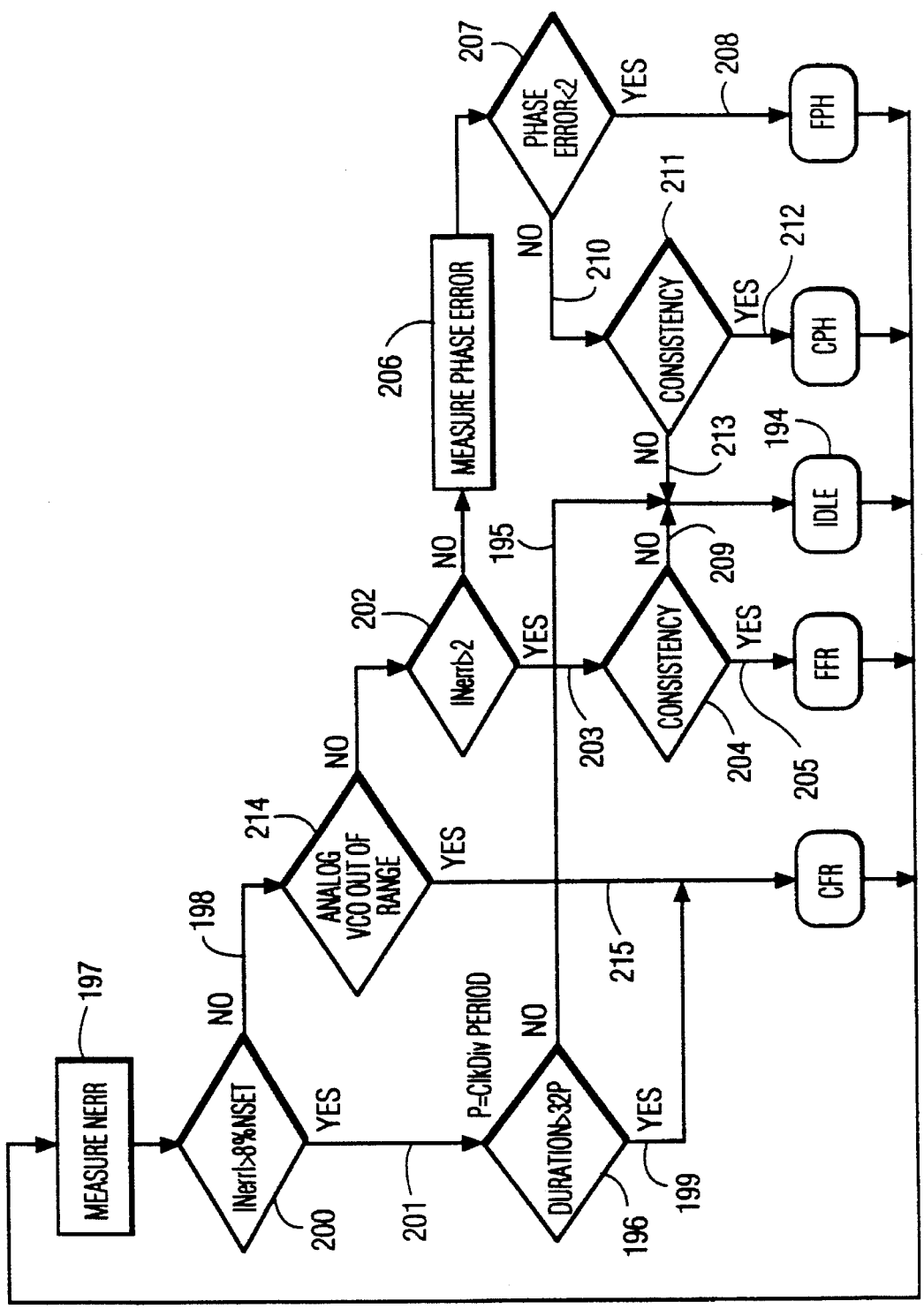
FIG. 5 illustrates a flow chart useful for explaining the operation of the PLL of FIG. 1.
Figure 6:
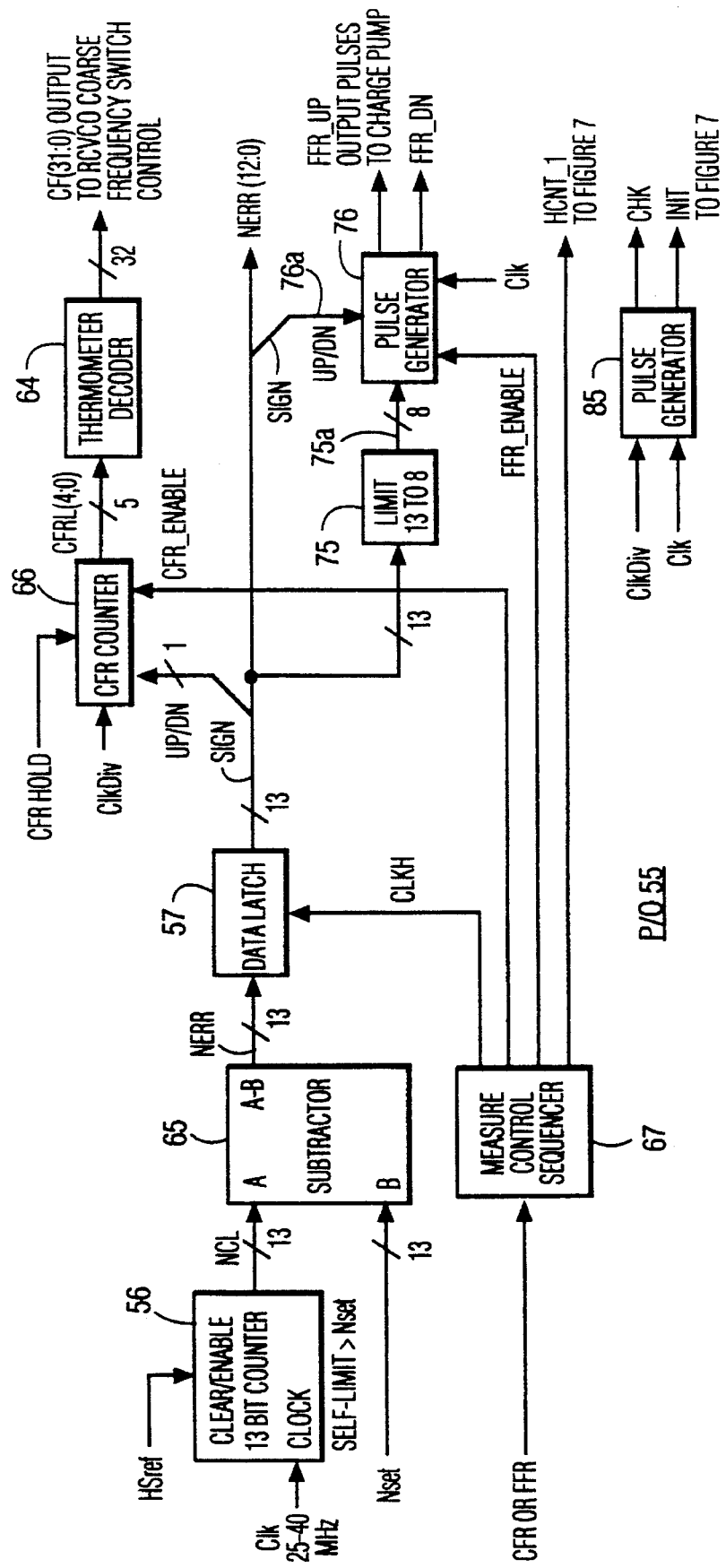
FIGS. 6, 7A and 7B illustrate more detailed diagrams of portions of the PLL of FIG. 1.
Figure 7A:
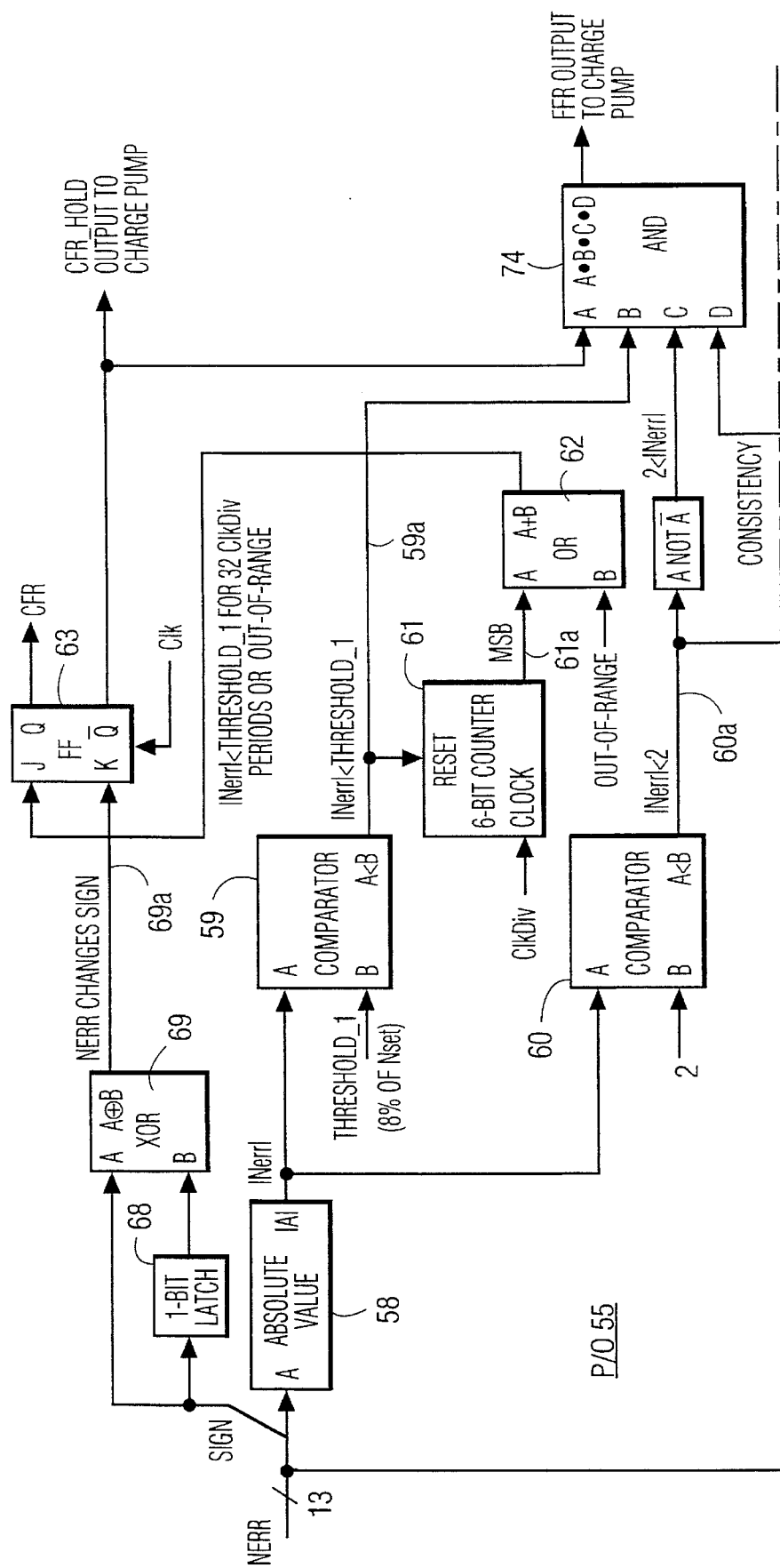
Figure 7B:
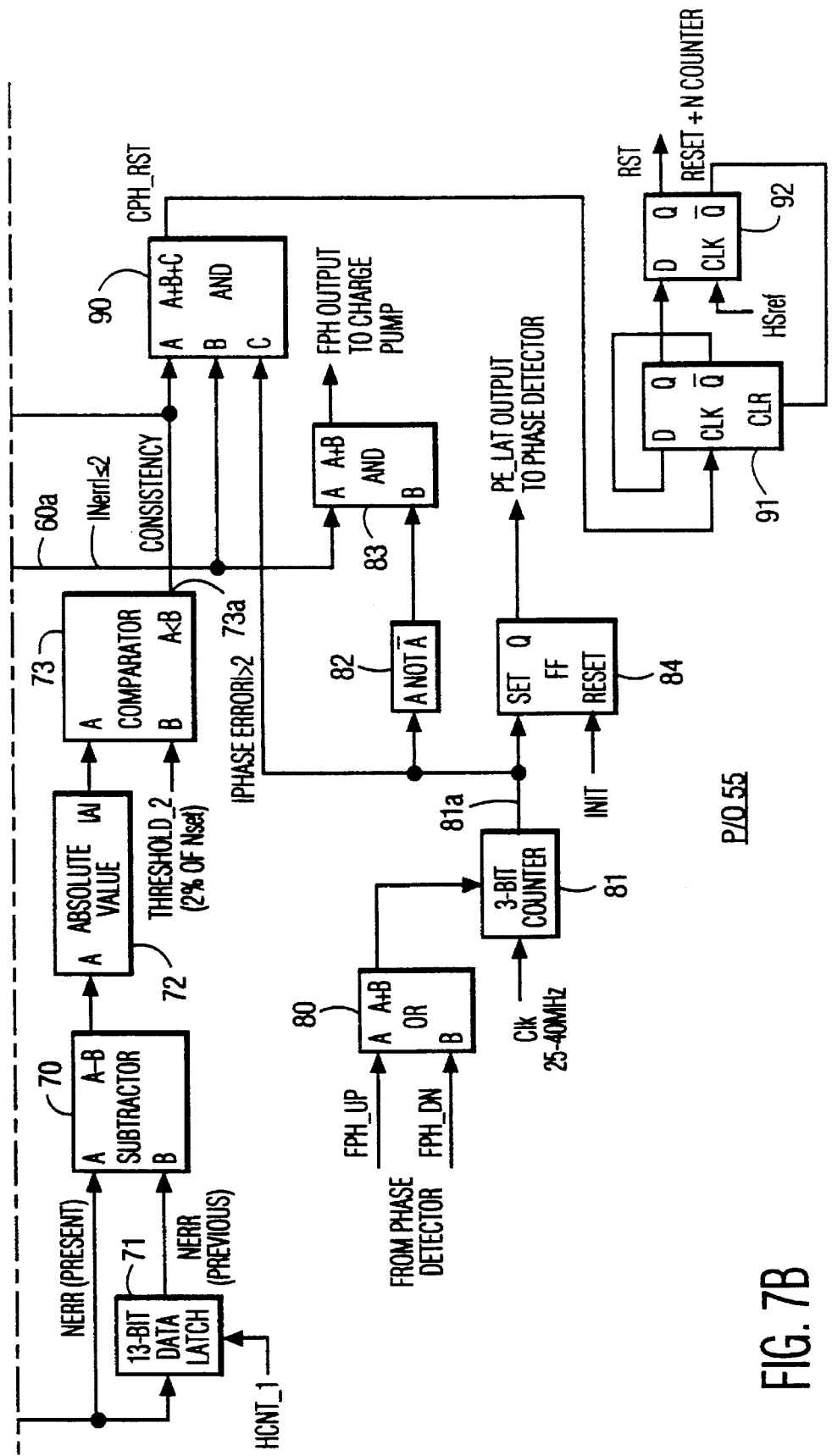

To control the frequency of RCVCO 53, sync signal HSRef of FIG. 1 is coupled to a frequency detector and control stage 55. FIG. 5 illustrates a flow chart useful for explaining the operation of PLL 100 of FIG. 1. FIGS. 6, 7A and 7B illustrate corresponding portions of stage 55 of FIG. 1 in more detailed block diagram. Similar symbols and numerals in FIGS. 1, 2A–2C, 3–6, 7A and 7B indicate similar items or functions.

Figure 9:
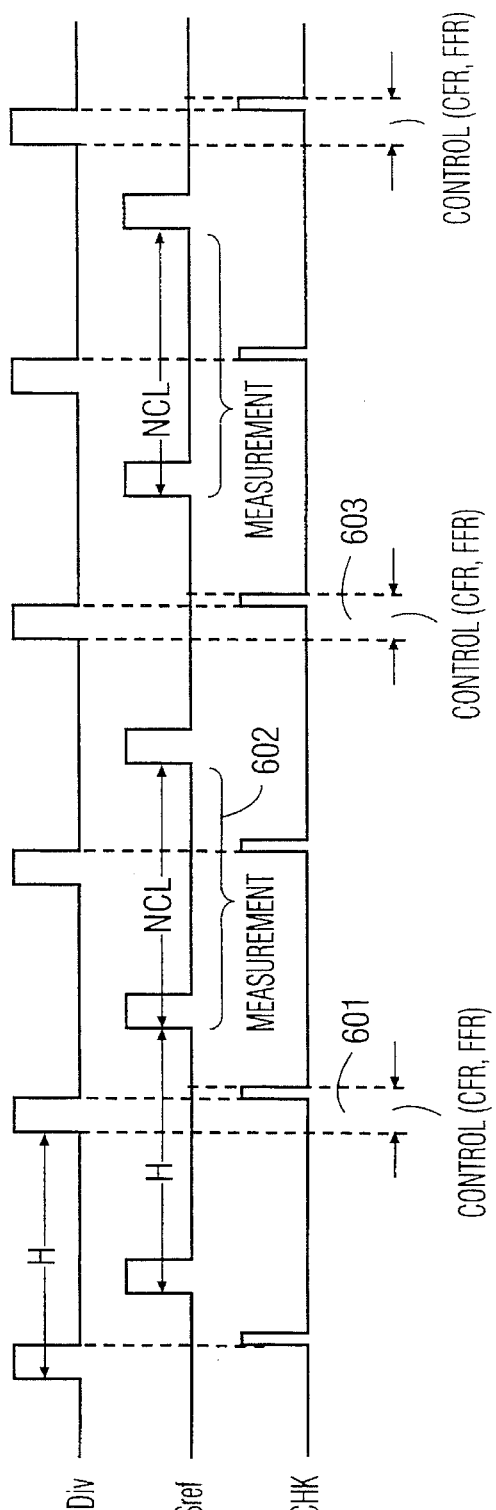
FIGS. 9a–9c are waveforms useful for explaining the operation of the PLL of FIG. 1.

In the portion of stage 55 that is shown in FIG. 6, signal HSRef is coupled to an input terminal Clear/Enable of a 13-bit-counter 56. Signal Clk of RCVCO 53 of FIG. 1 is coupled to an input terminal CLOCK of counter 56 of FIG. 6. FIGS. 9a and 9b illustrate an example of the pulses of signals ClkDiv and HSRef, respectively, of FIG. 6. Similar symbols and numerals in FIGS. 1, 2A–2C, 3–6, 7A, 7B and 9A–9C indicate similar items or functions.

Counter 56 of FIG. 6 counts pulses of signal Clk that occur during a given period H and referred to as an interval MEASUREMENT in FIG. 9b. At the end of interval MEASUREMENT, counter 56 of FIG. 6 contains a binary word signal NCL. Signal NCL has a numerical value that is equal to the number of clock pulses or periods of signal Clk that occur during a given period of signal HSRef. Thus, signal NCL contains the ratio between the frequency of signal Clk and that of signal HSRef.

Signal NCL is coupled to a subtractor 65 that generates a binary word signal Nerr by forming a difference between the value of signal NSET and that of signal NCL. Signal NSET is a constant binary word that is equal to the ratio between the frequency of signal Clk and that of signal ClkDiv, as indicated before. Signal Nerr is stored in a latch 57 when a timing control signal CLKH occurs. Signal CLKH occurs immediately following that period H of signal HSRef during which signal Nerr is measured and generated.

Stored signal Nerr is read out at an output of latch 57 as an output signal NERR. Error signal NERR has a value that is equal to a difference between the number of clock periods of signal Clk that occur during the given period MEASUREMENT of signal HSRef of FIG. 9b and the number of clock periods of signal Clk of FIG. 6 that occur during the period of signal ClkDiv of FIG. 9a. Such difference is zero and represents no error, for example, when PLL 100 of FIG. 1 is in a phase-lock condition. Thus, signal NERR is indicative of a cycle related or frequency error. The measurement operation in which signal NERR is developed is depicted in a flowchart path 197 of the flow chart of FIG. 5.

Frequency error indicative signal NERR of FIG. 6 is coupled to an input of an absolute value forming stage 58 of FIG. 7A that produces a bianry word signal |Nerr|. Signal |Nerr| is equal to the absolute value of signal NERR. Signal |Nerr| is compared in a comparator 59 with a constant value word signal THRESHOLD_1 that is equal to 8% of the magnitude of word signal NSET. The desired period length of signal ClkDiv is contained in word signal NSET. Comparator 59 generates a word signal 59a when the error in the length of the period of signal ClkDiv, as measured by the number of clock cycles of signal Clk, is greater than 8% of the desired period length of signal ClkDiv.

Signal 59a is coupled to a reset input terminal RESET of a 6-bit counter 61 that counts up once in each period of clock signal ClkDiv, when counting is enabled in counter 61. Counter 61 produces a signal 61a, the most-significant-bit MSB of counter 61. Counting is enabled in counter 61 when signal 59a is generated.

Signal 61a is coupled via an OR gate 62 to a "J" input terminal of a flip-flop 63. A TRUE state of an output signal CFR of flip-flop 63 is obtained should, in each of the 32 immediately preceding periods H of signal ClkDiv, the error in the length of the period of signal ClkDiv, as provided by the value of signal |Nerr|, be greater than 8% of the desired period length.

As long as such 32 periods H of signal ClkDiv of FIG. 9a have not elapsed, RCVCO 53 of FIG. 1 is not affected, referred to as an idle mode operation and depicted in a path 194 of the flow chart of FIG. 5. Advantageously, the idle mode occurs in a manner to prevents the occurrence of the coarse frequency correction mode, for example, throughout a vertical blanking interval (VBI). During the vertical blanking interval, equalizing pulses EP of FIG. 1 occur. Pulses EP have a period that is one-half of period H. Therefore, equalizing pulses EP in signal HSRef of FIG. 1 produce a value of error signal |Nerr| of FIG. 7A that is greater than 8% of the desired period length. However, because the number of equalization pulses EP of FIG. 1 is smaller than 32, counter 61 and "OR" gate 62 of FIG. 7A prevent signal CFR from attaining the TRUE state, throughout the vertical blanking interval. Therefore, operation in the coarse frequency correction mode is prevented. As a result of the operation in the idle mode, advantageously, the phase of RCVCO 53 is not disturbed throughout the vertical blanking or retrace interval.

Assume that the number of periods of signal ClkDiv in which error signal |Nerr| is greater than 8% of the desired period length exceeds 32. This situation is indicative of a large frequency error not due to operation in the vertical blanking interval. Therefore, signal CFR of flip-flop 63 of FIG. 7A would be generated at the TRUE state. When signal CFR is generated, it causes PLL 100 of FIG. 1 to operate in the coarse frequency error correction mode of operation. During operation in the coarse frequency error correction mode, coarse frequency error is reduced sequentially in RCVCO 53 in switching steps. The way signal CFR is generated is indicated in flow than paths 197, 200, 201, 196 and 199 of the flow chart in FIG. 5.

Figure 10:
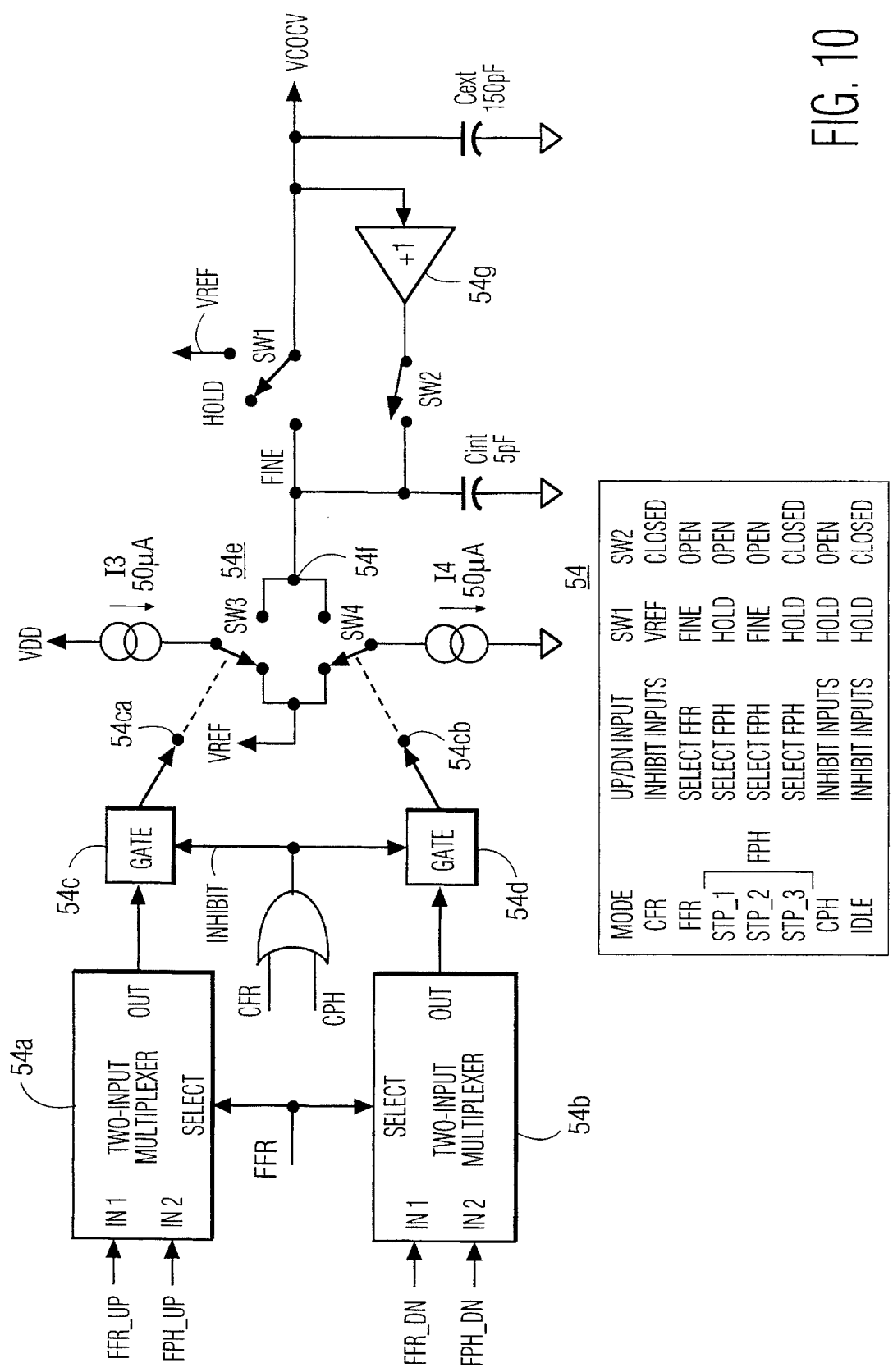
FIG. 10 illustrates a schematic of a charge pump stage of the PLL of FIG. 1.

FIG. 10 illustrates a more detailed diagram of charge pump stage 54 of FIG. 1. Similar symbols and numerals in FIGS. 1, 2A–2C, 3–6, 7A, 7B, 9a–9c and 10 indicate similar items or functions. The table in FIG. 10 provides the direction of signal flow and the state of the switches in stage 54. Throughout the coarse frequency error correction mode, charge pump stage 54 of FIG. 10 produces analog control signal VCOCV of RCVCO 53 of FIG. 2A at a constant level that is equal to reference voltage VREF, provided via a switch SW1 of FIG. 10. Signal VCOCV of FIG. 10 is established approximately at its middle voltage variation range.

In the coarse frequency error correction mode, a 5-bit binary counter 66 of FIG. 6 counts up or down alternate pulses of signal ClkDiv. The direction of counting in counter 66, up or down, is determined in accordance with the state of a most significant or a sign bit SIGN of word signal NERR. A 5-bit output word signal CFRL(4:0) of counter 66 is coupled to an input of a decoder 64, referred to herein as a "thermometer" decoder. Thermometer decoder 64 produces the aforementioned 32 separate control signals CF(4j+i) by decoding the 5-bit signal CFRL(4:0).

The table of FIG. 8 shows those of signals CF(4j+i) of FIGS. 2A, 2B and 8 that are at the TRUE state and those that are at the FALSE state for each value of 5-bit word signal CFRL(4:0) of FIG. 6 and 8. In the table of FIG. 8, binary "1" represents the TRUE state and binary "0" represents the FALSE state. As shown in FIG. 8, when counter 66 of FIG. 6 counts up, only one of control signals CF(4j+i) of FIG. 8 changes state. The change in state is from FALSE to TRUE state. Similarly, when counter 66 of FIG. 6 counts down, only one of control signals CF(4j+i) of FIG. 8 changes state; whereas, the change in state is from TRUE to FALSE.

In the coarse frequency error correction mode, a measure/control sequencer unit 67 of FIG. 6 generates a signal CFR_Enable that enables counter 66 to count up/down alternate pulses of signal ClkDiv. Alternate pulses of signal ClkDiv occur in alternate periods H of signal HSRef. Only during intervals CONTROL, that occur in alternate periods of signal HSRef of FIG. 9b, between intervals MEASUREMENT, signal CFR_Enable enables counter 66 of FIG. 6 to change states. During the other alternate periods of signal HSRef of FIG. 9b, when intervals MEASUREMENT occur, the value of signal NCL is measured, as explained before, but counter 66 of FIG. 6 does not change states. Counter 66 does not change states while signals NERR or NCL of FIG. 9b are being measured. By preventing counter 66 of FIG. 6 from changing states, during a given interval MEASUREMENT of FIG. 9b, the frequency of RCVCO 53 of FIG. 1 does not change at the same time that the frequency of RCVCO 53 is being measured. Thus, a given switching step in the coarse frequency correction mode requires two horizontal clock pulses of signal ClkDiv and occurs every pair of periods H. As a result of not having the frequency of RCVCO 53 changed when it is being measured, a more stable and precise frequency control operation is obtained.

For explanation purposes of the coarse frequency error correction mode, assume that, in a given interval MEASUREMENT of FIGS. 9a and 9b, denoted as interval 602, the measured frequency of signal Clk of RCVCO 53 of FIGS. 2A–2C is higher than required. Such situation is indicated by the occurrence of a positive value of signal NERR of FIG. 6. Consequently, at the end of the immediately following interval CONTROL of FIGS. 9a and 9b, denoted as interval 603, counter 66 of FIG. 6 is incremented. The result is that a corresponding pair of capacitors CA(4j+i) and CB(4j+i) of FIGS. 2A, 2B and 2C are switched-in, in accordance with updated incremented value of word signal CFRL(4:0) of FIG. 6. The updated value of signal CFRL(4:0) is incremented or decremented in accordance with the sign bit SIGN of signal NERR of FIG. 6. Because additional pair of capacitors is coupled to the positive feedback paths, a decrease in the frequency of signal Clk occurs. On the other hand, if the frequency of signal Clk is lower than required, a pair of capacitors CA(4j+i) and CB(4j+i) of FIGS. 2B or 2C would be switched out or recoupled from the positive feedback paths. The capacitor switching occurs in the immediately following interval CONTROL, or interval 603, of FIGS. 9a and 9b, causing an increase in the frequency of RCVCO 53 of FIGS. 2A–2C.

Thermoter decoder 64 of FIG. 6 operates in such a way that a change of state in counter 66 causes only one pair of switched capacitors in the corresponding pair of positive feedback paths, respectively, to be switched in or out and no other pair of capacitors is affected, as explained before. Therefore, advantageously, the change, increase or decrease, in the frequency of signal Clk of FIG. 2C is monotonical and not affected by component tolerances. Thus, for the entire frequency range, the frequency of signal Clk is proportional to the value of word signal CFRL(4:0) of FIG. 6.

For explanation purpose, assume that prior to the end of a given interval CONTROL, denoted as an interval 601, of FIGS. 9a and 9b, the value of signal CFRL(4:0) of FIG. 6 is equal to 23. The value 23 corresponds to j=5 and i=3, since 4j+i=23. As explained before, i is selected only from the values 0 to 3 and, j is selected only from the values 0 to 7.

Further assume that the sign bit SIGN of signal NERR is such that counter 66 of FIG. 6 counts up, at the end of interval 601. Thus, in a subsequent interval MEASUREMENT, denoted as an interval 602 of FIGS. 9a and 9b, signal CFRL(4:0) of FIG. 6 contains an incremental value that is equal to 24, corresponding to j=6 and i=0 since 4j+i=24. Only capacitors CA(24) and CB(24) in banks SWA(0) and SWB(0), respectively, of FIG. 2 will be switched in and coupled to the corresponding pair of positive feedback paths in RCVCO 53 at the end of interval 601 of FIGS. 9a and 9b. The switched capacitors that were already coupled to the corresponding positive feedback paths, prior to the end of interval 601 of FIGS. 9a and 9b, will not be affected by the increment of the value of signal CFRL(4:0) of FIG. 8. In this way, capacitors CA(4j+i) and CB(4j+i) of FIGS. 2B and 2C are switched in or out in a progressive or monotonical manner.

In each interval CONTROL of FIG. 9b, the change in the frequency of RCVCO 53 of FIGS. 2A–2C is approximately 4% of the entire range of operating frequencies of RCVCO 53. Thus, the entire frequency range of RCVCO 53 can be sequenced in 32 capacitor switching steps or fewer.

Sign bit SIGN of signal NERR of FIG. 7A is coupled, both delayed and undelayed, to a pair of input terminals of an exclusive or gate 69. The delayed sign bit is produced in a latch 68. Gate 69 produces an output signal 69a that is coupled to a "K" input terminal of J-K flip-flop 63.

In carrying out an inventive feature, switched capacitors CA(4j+i) and CB(4j+i) are switched in or switched out of the positive feedback path in steps of a negative feedback loop. The generation of signal CFR is disabled and operation in the coarse frequency error control mode ceases when the difference between the measured and expected lengths of the period of signal ClkDiv, as determined by the sign bit SIGN of signal NERR, changes sign. The sign change of signal NERR is indicative of attaining a frequency error that is smaller or equal to 4% of the entire frequency range. Thereafter, counter 66 of FIG. 6 ceases to change states and the last state of signals CFRL (4:0) and CF (4j+i) remains unchanged.

Signal NERR of FIG. 7B is coupled to a first input A of a subtractor 70. Signal NERR, delayed via a latch 71 by one period of signal ClkDiv, is coupled to a second input B of subtractor 70. An absolute value of a difference between the input signals of subtractor 70 is obtained in an absolute value forming stage 72 and is compared in a comparator 73 against a value contained in a digital word signal THRESHOLD_2.

Assume that the period length error of signal ClkDiv changes, from a given period H to the immediately following one of signal ClkDiv, by less than 2% of the expected period length of clock signal ClkDiv. The 2% threshold value is contained in signal THRESHOLD_2. Therefore, a signal CONSISTENCY is generated in an output 73a of comparator 73. Thus, signal CONSISTENCY is generated when the magnitude of signal NERR varies by no more than 2% of the value of signal NSET of FIG. 6 from one clock period H to the immediately following one of signal ClkDiv. It follows that signal CONSISTENCY of FIG. 7B is indicative of the presence of a stable and noise free synchronizing signal HSRef and error signal Nerr.

Signal |Nerr| of FIG. 7A is compared with a constant value that is equal to 2 in a comparator 60. Comparator 60 generates a signal 60a when the error or difference in the period length of signal ClkDiv with respect to that of signal HSRef is smaller than 2 clock periods of signal Clk.

Assume that all of the followings occur: signal CONSISTENCY of FIG. 7A is produced, the value of signal |Nerr| is greater than or equal to 2, but smaller than 8% of the value of signal Nset, as provided in signal 60a of FIG. 7A and signal CFR is not generated. Therefore, an "AND" gate 74 produces a signal FFR. Signal FFR initiates and establishes a fine or gradual frequency error correction mode of operation in which the state of coupling or decoupling of the switched capacitor in FIGS. 2A–2C is not affected. Flow chart paths 202, 203, 204 and 205 in the flow chart of FIG. 5 depict the conditions for the generation of signal FFR of FIG. 7A. On the other hand, should signal CONSISTENCY not be generated, RCVCO 53 of FIG. 1 will not be affected, resulting in the aforementioned idle mode of operation, as depicted in flow chart paths 197, 204 and 209 of the flow chart of FIG. 5.

In the fine frequency error correction mode, signal FFR of FIG. 7A controls the operation of charge pump stage 54 of FIG. 10 for varying analog signal VCOCV. Variation of signal VCOCV causes the frequency of RCVCO 53 of FIG. 1 to vary in a gradual manner and without switching steps of the switched capacitor, unlike in the coarse frequency error correction mode.

Signal NERR of FIG. 6 is coupled through a word limiter 75 to a pulse generator 76. Limiter 75 produces an eight-bit, 2's complement word signal 75a from the least significant eight bits of signal NERR. Signal NERR is a 13-bit word signal. Should the magnitude of signal NERR be larger than what can be represented by eight-bit word signal 75a, signal 75a would be established at a value that is equal to the upper limit, positive or negative, of an eight-bit, 2's complement word. Word signal 75a is stored in a binary counter, not shown, of a pulse generator 76. Pulse generator 76 generates a pulse of a signal FFR_UP or a pulse of a signal FFR_DN, in accordance with bit SIGN of signal NERR.

A given pulse of output signal FFR_UP has a pulse width that is proportional to the magnitude of error signal NERR and is produced when the value of signal NERR is negative. Signal FFR_UP occurs when the frequency of signal Clk is lower than required. Similarly, a given pulse of signal FFR_DN has a pulse width that is proportional to the magnitude of signal NERR and occurs when the frequency of signal Clk is higher than required.

Under the control of signal FFR, signal FFR_UP or FFR_DN of FIG. 10 is selected and coupled through the corresponding one of a pair of two-input multiplexers 54a and 54b and through the corresponding one of a pair of gates 54c and 54d to the corresponding one of a pair of control terminals 54ca and 54cb of the corresponding one of a pair of switches SW3 and SW4. When the pulse of signal FFR_UP is generated, switch SW3 couples a positive pulse current I3 to a terminal 54f. Similarly, when the pulse of signal FFR_DN is generated, switch SW4 couples a negative pulse current I4 to terminal 54f.

A capacitor Cint, formed using an integrating circuit fabrication technique, is coupled in parallel with a discrete capacitor Cext via switch SW1. This is done by having the selector of switch SW1 coupled to terminal 54f in the fine frequency correction mode. The control of switch SW1 is shown by the table in FIG. 10. Consequently, capacitors Cext and Cint are charged in parallel, when signal FFR_UP is produced, by an amount that is proportional to the pulse width of signal FFR_UP. Capacitors Cext and Cint are discharged, in a similar manner, when signal FFR_DN occurs. Signal VCOCV is produced in capacitor Cext and is coupled to RCVCO 53 of FIG. 2A.

Similarly to the coarse frequency error correction mode, and for similar reasons, during intervals MEASUREMENT, that occur during alternate periods H of signal HSRef of FIG. 9b, the frequency of signal Clk does not change simultaneously with the measurement of the frequency error. Charging/discharging of capacitors Cint and Cext of FIG. 10, in accordance with signal NERR, is enabled only during the other alternate periods intervals CONTROL of signal HSRef of FIG. 9b. During operation in the fine frequency error correction mode, the difference between the period length of signal ClkDiv and that of signal HSRef is brought to within 2 period length of signal Clk or approximately 0.2% of period H of signal HSRef.

The correction range that is produced by signal VCOCV in the fine frequency error correction mode is approximately ±8% of the entire frequency range of RCVCO 53 of FIGS. 2A–2C. Therefore, advantageously, signal VCOCV has a sufficiently large range that overlaps each range of frequencies associated with a given switching step of signals CF(4j+i) that occurs in the coarse frequency error correction mode. This is so because, as explained before, the range of frequencies associated with a given switching step in the coarse frequency error .correction mode is equal to approximately 4% of the entire frequency range of RCVCO 53. Advantageously, the correction range of signal VCOCV is still sufficiently small so that sensitivity to noise is reduced.

As explained before, when signal CONSISTENCY of FIG. 7B is not generated, the idle mode of operation occurs. The idle mode occurs when, for example, signal HSRef of FIG. 1 is contaminated with noise. In the idle mode, switch SW1 of FIG. 10 decouples capacitor Cext from terminal 54f. Therefore, capacitor Cext of FIG. 10 is neither charged nor discharged and signal VCOCV is maintained relatively constant. In the idle mode, signal VCOCV is coupled via a unity gain amplifier and a switch SW2 to capacitor Cint such that the capacitor voltage in terminal 54f of capacitor Cint tracks the voltage of signal VCOCV. The control of switch SW2 is shown by the table in FIG. 10.

Assume that after an interruption interval in signal HSRef of FIG. 1, normal operation signal HSRef is restored such that signal CONSISTENCY of FIG. 7B is again produced. Because of the operation in the idle mode, signal VCOCV of FIG. 10 is not disturbed and is more likely to be already maintained at the approximately required level for steady state phase lock operation after the interruption interval in signal HSRef has ended. Thus, transient condition in PLL 100 of FIG. 1 may be, advantageously, of short duration.

Figure 11:
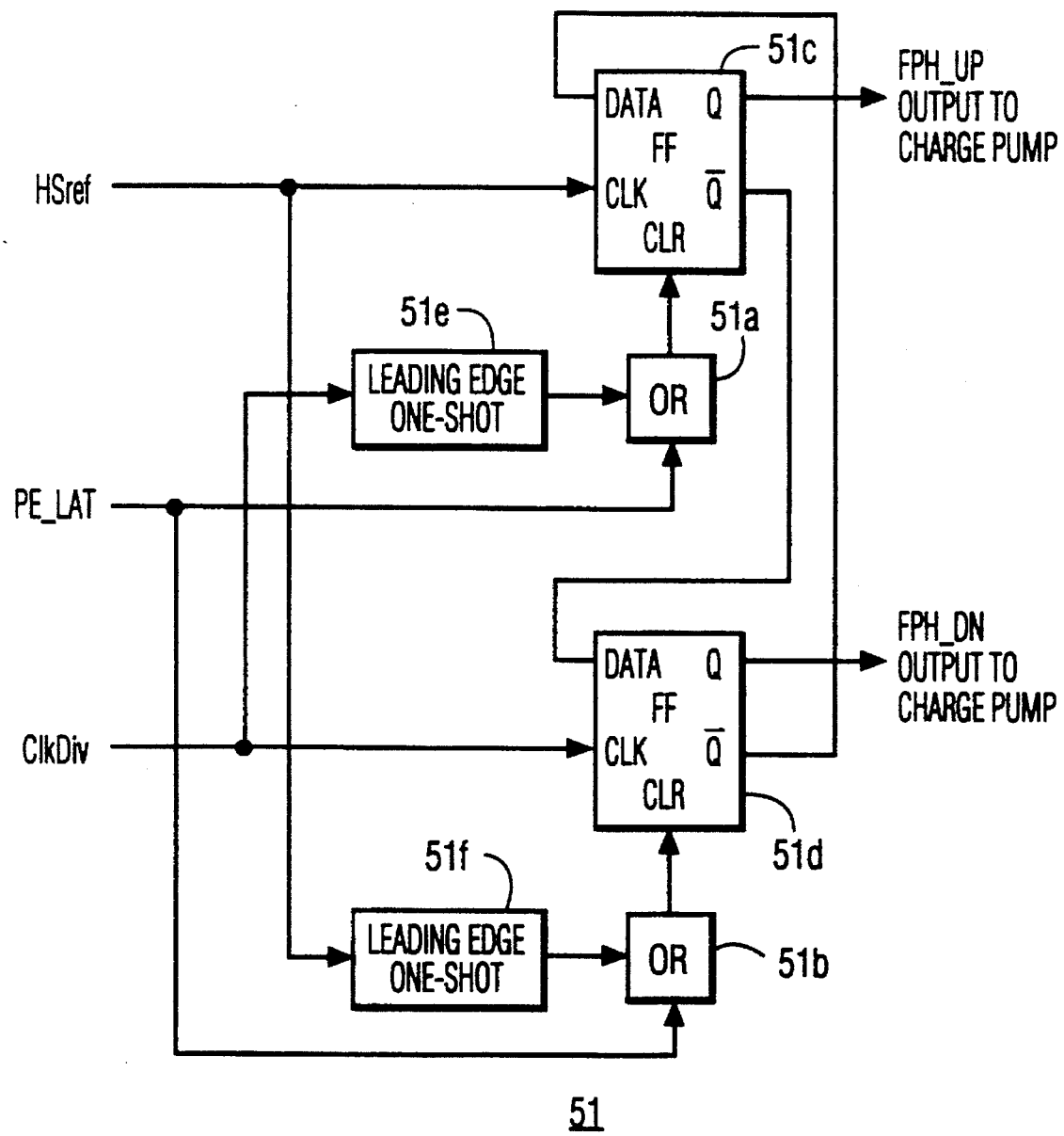
FIG. 11 illustrates a detailed schematic of a phase detector of the PLL of FIG. 1.

FIG. 11 illustrates in more detail a phase detector 51 of FIG. 1 that is used in a phase error correction mode of operation. FIGS. 12a–12g illustrate corresponding waveforms. Similar symbols and numerals in FIGS. 1, 2A–2C, 3–6, 7A, 7B, 8, 9a–9c, 10, 11 and 12a–12g indicate similar items or functions. Detector 51 of FIG. 11 includes a D-type flip-flop 51c that is clocked by signal HSRef and reset by signal ClkDiv. Flip-flop 51c generates a given pulse of signal FPH_UP of FIG. 12c when the leading edge of signal ClkDiv of FIG. 12b lags behind that of signal HSRef of FIG. 12a. A D-type flip-flop 51d of FIG. 11 is clocked by signal ClkDiv and reset by signal HSRef via a one-shot multivibrator 51f. Flip-flop 51d generates a given pulse of signal FPH_DN of FIG. 12g, when the leading edge of signal ClkDiv of FIG. 12e leads that of signal HSRef of FIG. 12a. The pulse width of each of pulse signals FPH_UP and FPH_DN is proportional to the phase difference. Only one of pulse signals FPH_UP and FPH_DN can be generated at a given period H.

Pulse signal FPH_UP or FPH_DN of FIG. 7B is coupled via an "OR" gate 80 to a 3-bit binary counter 81. When the pulse width of either pulse is smaller than 2 clock periods of signal Clk, that is indicative of a relatively small phase error, an output signal 81a is at a FALSE level. Signal 81a is coupled via an inverter 82 to an input B of an "AND" gate 83. Frequency error indicative signal 60a is coupled to a second input A of gate 83. Signal 60a is generated when signal |Nerr| is smaller than 2, representing 2 clock periods of signal Clk.

For example, following operation in the fine frequency error correction mode, when both the phase error is small, as indicated by signal 81a being at the FALSE level, and the frequency error is small, as indicated by the generation of signal 60a, gate 83 generates a signal FPH. As a result, a fine phase error correction mode occurs. How chart paths 202, 206, 207 and 208 in the flow chart of FIG. 5 depict the way the fine phase error correction mode is obtained.

In the fine phase error correction mode, unlike in the fine and coarse frequency error correction modes, the phase error is both measured and corrected in each period H of signal HSRef of FIG. 9b. In the fine phase error correction mode, analog signal VCOCV of FIG. 10 that is proportional to the phase error is used to acquire and maintain phase lock condition.

FIGS. 13a–13d illustrate waveforms useful for explaining the operation in the fine phase error correction mode. Similar symbols and numerals in FIGS. 1, 2A–2C, 3–6, 7A, 7B, 8, 9a–9c, 10, 11, 12a–12g and 13a–13d indicate similar items or functions.

When signal FPH of FIG. 7B is generated, signal FPH_UP, alternatively, FPH_DN, of FIG. 10 is coupled through multiplexers 54a and 54b and through gates 54c and 54d to terminals 54ca and 54cb of switches SW3 and SW4, respectively. Signal FPH_UP, alternatively, FPH_DN is applied to capacitors Cint and Cext in the following three operation sequence that occurs during each period of signal ClkDiv of FIG. 13B.

In the first operation of the aforementioned three operation sequence, switch SW1 of FIG. 10 is at a position HOLD. Should the pulse of signal FPH_UP be generated, switch SW3 would couple positive pulse current I3 to terminal 54f. Similarly, should the pulse of signal FPH_DN be generated, switch SW4 would couple negative pulse current I4 to terminal 54f. Capacitor Cint is charged when signal FPH_UP is produced by an amount that is proportional to its pulse width and is discharged when signal FPH_DN is produced. Thus, capacitor Cint and currents I3 and I4 operate as an integrator or a low pass loop filter that develops in capacitor Cint a voltage proportional to the phase error.

In the second operation of the sequence, a pulse generator 85 of FIG. 6 generates a pulse signal CHK of FIGS. 6 and 13c following the trailing edge of signal ClkDiv of FIG. 13B. Pulse signal CHK of FIG. 6 causes, in a manner not shown, switch SW2 of FIG. 10 to open and switch SW1 to couple capacitor Cext to terminal 54f. Thus, capacitors Cint and Cext are coupled in parallel. Therefore, the charge in capacitor Cext varies in accordance with that of capacitor Cint and is determined by the measured phase error. In this way, charge transfer occurs between capacitors Cext and Cint.

In the third operation of the sequence, generator 85 of FIG. 6 generates a pulse signal INIT of FIGS. 6 and 13d following pulse signal CHK of FIG. 13c. Pulse INIT causes, in a manner not shown, switch SW1 of FIG. 10 to be in position HOLD and switch SW2 to be closed. In this way, the initial condition voltage is maintained in capacitor Cint the same as in larger capacitor Cext in preparation for the next first operation in the next three operation sequence the next three operation sequence occurs in the next period of signal ClkDiv. Advantageously, signal ClkDiv may suffer from less than, for example, 2 ns jitter in the fine phase correction mode.

In accordance with another inventive feature, fine frequency/phase control signal VCOCV of FIG. 1 is also coupled to a comparator 91. A signal OUT-OF-RANGE would be generated by comparator 91 should the magnitude of signal VCOCV be outside a predetermined voltage range. Signal OUT-OF-RANGE is indicative of a situation in which signal VCOCV approaches a magnitude that is outside a linear control range of operation of RCVCO 53. When signal OUT-OF-RANGE is produced, PLL 100 begins operating in the coarse frequency control mode that was explained before. Flow chart paths 214 and 215 in the flow chart of FIG. 5 depict such situation.

Should the phase error be large, resulting in a time difference between the leading edge of signal HSRef of FIG. 12a and that of signal ClkDiv of FIG. 12b or 12c that is equal to or greater than 2 clock periods of signal Clk of FIG. 7B, signal 81a would be generated. Signal 81a causes a flip-flop 84 to be "set" and to generate an output signal PE_LAT. Signal PE_LAT is coupled to flip-flop 51c and 51d of phase detector 51 of FIG. 11 via "OR" gates 51a and 51b for terminating or producing a trailing edge of the then occurring pulse of signal FPH_UP or FPH_DN. Thus, advantageously, in the fine phase error correction mode, when detector 51 controls stage 54 of FIG. 10, detector 51 is prevented from varying the frequency/phase of signal Clk by an excessive amount in each period of signal ClkDiv.

Signal 81a of FIG. 7B at the TRUE level that is indicative of a large phase error is coupled to an input C of an "AND" gate 90. Signal CONSISTENCY that is indicative of consistent frequency error from one period H of signal HSRef of FIG. 9b to the immediately next one, as explained before, is coupled to a second input A of gate 90 of FIG. 7B. Signal 60a that is indicative of a small frequency error, when the value of signal |Nerr| is smaller than 2, is coupled to a third input B of gate 90. Gate 90 generates a signal CPH_RST when all the three signals, 81a, 60a and CONSISTENCY, are generated. Signal CPH_RST is coupled to a clock input of a D-type flip-flop 91. An output Q of flip-flop 91 is coupled to an input D of a D-type flip-flop 92 that produces a pulse signal RST when the leading edge of signal HSRef occurs following the generation of signal CPH_RST.

Signal RST is coupled to +N counter 52 of FIG. 1 for presetting the flip-flops, not shown, of counter 52 in a manner to provide an immediate phase lock between signals HSRef and ClkDiv. Thus, signal RST provides a coarse phase error correction mode of operation. Flow chart paths 210, 211 and 212 in the flow chart of FIG. 5 depict the way the coarse phase correction mode is obtained. This mode can occur when, for example, the phase of signal HSRef of FIG. 1 that is produced in a video tape recorder, changes abruptly, during a vertical retrace interval of a playback mode. The coarse phase error correction is accomplished via a signal path between RCVCO 53 of FIG. 1 and phase detector 51 in a manner that bypasses the signal path of signal VCOCV. As a result of the abrupt or coarse phase correction, the phase of signal ClkDiv is aligned with that of signal HSRef without significantly affecting the phase of signal Clk. In this way, advantageously, transient disturbance in RCVCO 53 is eliminated or significantly reduced.

Should signal 81a of FIG. 7B that is indicative of a large phase error be generated and signal CONSISTENCY, that is indicative of a stable sync signal HSRef, not be generated, signal RST would not be generated and the idle mode of operation would occur. How chart path 213 in the flow chart of FIG. 5 depicts this way in which the idle mode is obtained. The advantage of operating in the idle mode and preventing the coarse phase error correction when signal CONSISTENCY of FIG. 7B is not generated is that disturbance or transient in PLL 100 of FIG. 1 may be reduced. Such disturbance may be reduced when, for example, the duration of the interruption in signal HSRef is short.

What is claimed is:

1. An apparatus for generating an oscillatory signal that is locked to an input signal, comprising:

an amplifier;

a plurality of switched reactive elements selectively coupled in a positive feedback path formed between an output and an input of said amplifier for generating said oscillatory signal having a frequency that is selected from a corresponding portion of a range of frequencies in accordance with a selection of said switched reactive elements;

first means responsive to said oscillatory signal for measuring a frequency error between said oscillatory and input signals and for generating a first switching control signal that is coupled to a switching arrangement associated with said switched reactive elements to select said switched reactive elements in accordance with said frequency error such that when said frequency error exceeds a first value, the selection of said switched reactive elements varies in switching steps of a coarse frequency correction mode of operation, to reduce said frequency error progressively in successive switching steps; and second means responsive to said oscillatory signal and to said input signal for generating a second control signal that is coupled to a control input of said amplifier for varying said frequency of said oscillatory signal within said corresponding portion of said range to correct said frequency error in a fine error correction mode of operation when said frequency error does not exceed said first value, without varying the selection of said switched reactive elements.

2. An apparatus according to claim 1 further comprising, a comparator responsive to said second control signal and to a signal at a reference level and coupled to said first means for initiating operation in said coarse frequency error correction mode of operation, when said second control signal is outside a predetermined correction range of said oscillator.

3. An apparatus according to claim 1 wherein said second control signal generating means comprises a frequency detector for generating a third signal that is indicative of said frequency error and a phase detector for generating a fourth signal that is indicative of a phase error, said third and fourth signals being selectively coupled to said control input of said amplifier to form said second control signal at said control input, such that when said frequency error is smaller than said first value and larger than a second value, said third signal is applied to said oscillator in a fine frequency error correction mode of operation and when said frequency error is smaller than said second value said fourth signal is applied to said oscillator in a fine phase error correction mode of operation.

4. An apparatus according to claim 1 wherein said second control signal is an analog signal.

5. An apparatus according to claim 1 wherein a given switched reactive element comprises a switched capacitor.

6. An apparatus according to claim 1 wherein said first means comprises, means for generating a coded signal and a decoder for decoding said coded signal to generate a plurality of switch control signals that are applied to said switches in a manner to vary said frequency of said oscillator signal monotonically in each switching step.

7. An apparatus according to claim 1 wherein an impedance of a given switched reactive element determines said frequency of said oscillatory signal.

8. Apparatus for generating an oscillatory signal that is locked to an input signal, comprising:

a controllable oscillator for generating said oscillatory signal;

a plurality of switched reactive elements selectively coupled to a feedback path of said oscillator for controlling said oscillatory signal in accordance with the selection of said switched reactive elements;

means coupled to said switched reactive elements for sequentially selecting from said switched reactive elements a given switched reactive element that is to be coupled to said feedback path and a given switched reactive element that is to be decoupled from said feedback path in a manner to reduce an error between said oscillatory and input signals in a given sequential step of a coarse error correction mode of operation;

means responsive to said oscillatory signal and to said input signal for generating a first signal that is indicative of said error therebetween, said first signal being coupled via a loop filter to a control input of said oscillator to control said oscillator in a fine error correction mode of operation when said error is smaller than a first value such that in said fine error correction mode of operation the selection of said switched reactive elements does not vary; and a comparator responsive to said filtered first signal and to a signal at a reference level and coupled to said switched reactive element selecting means for initiating operation in said coarse error correction mode of operation, when said filtered first signal is outside a predetermined correction range of said oscillator.

9. An apparatus for generating an oscillatory signal that is locked to an input signal, comprising:

a controllable oscillator for generating said oscillatory signal;

a source of said input signal at a frequency that is related to a scanning frequency;

a plurality of selectable switched reactive elements coupled in a feedback path of said oscillator;

a frequency detector responsive to said oscillatory and input signals for generating a first signal that is indicative of a frequency error therebetween;

a charge pump responsive to said first signal for generating a filtered second signal that is coupled to a control input of said oscillator for varying said frequency of said oscillatory signal in a fine frequency error correction mode of operation to correct for said frequency error in a feedback loop manner without varying a selection of said switched reactive elements;

means for initiating operation in a coarse frequency error correction mode in accordance with said first signal via a signal path that bypasses said charge pump when said frequency error exceeds a first predetermined magnitude such that in said coarse frequency error correction mode the selection of said switched reactive elements varies in a manner to reduce said frequency error; and a comparator responsive to said second signal of said charge pump and to a signal at a reference level and coupled to said switched reactive elements for initiating operation in said coarse frequency error correction mode of operation when a difference between said second signal and said signal at said reference level is outside a normal operation range of values.

10. An oscillator that is locked to a synchronizing signal, comprising:

a first amplifier;

a first switched reactive element selectively coupled in a first positive feedback path formed between an output and an input of said first amplifier;

a second amplifier;

a second switched reactive element selectively coupled in a second positive feedback path formed between an output and an input of said second amplifier for producing a pair of differentially symmetrical signals in said first and second positive feedback paths, respectively;

means for combining said pair of differentially symmetrical signals to generate an oscillatory signal;

a source of said synchronizing signal; and means coupled to said switched reactive elements for varying the selection of said switched reactive elements in a given switching step in a manner to reduce a frequency error of said oscillatory signal with respect to that of said synchronizing signal in a frequency correction mode of operation, such that, when the selection of said first switched reactive element varies in said first positive feedback path the selection of said second switched reactive element also varies in said second positive feedback path in a manner to maintain said pair of signals differentially symmetrical.

11. An oscillator according to claim 10 further comprising, means responsive to said oscillatory and synchronizing signals for generating a gain control signal that is coupled to a gain control input of one of said amplifiers for reducing one of a frequency error and a phase error in a fine error correction mode of operation.

12. An apparatus according to claim 11 wherein, in said given switching step, said gain control signal has a variation range that produces a larger frequency variation range in said oscillatory signal than that produced by varying the selection of said switched reactive elements in said given switching step.

13. An apparatus according to claim 11 wherein said gain control signal generating means comprises a phase detector for providing a phase correction in a fine phase correction mode of operation.

14. An apparatus according to claim 11 wherein said gain control signal generating means comprises a frequency detector for providing a frequency correction in a fine frequency correction mode of operation.

15. An apparatus according to claim 10 wherein said given switching step occurs sequentially at a rate that is equal to a multiple of a horizontal deflection frequency.

16. An apparatus according to claim 10 wherein at least one of said switched reactive elements comprises switched capacitors that are formed by an integrated circuit fabrication technique.

17. An apparatus according to claim 10 wherein said combining means comprises a differential amplifier having an inverting input terminal that is responsive to one of said pair of signals and a noninverting input terminal that is responsive to the other one of said pair of signals.

18. An R-C oscillator, comprising:

an amplifier having a controllable gain for generating a part of first and second signals at opposite phases;

a first R-C network responsive to said first signal to produce a third signal at an output of said first R-C network that is phase shifted with respect to said first signal, said first R-C network being coupled to a first switching arrangement that varies in accordance with a switch control signal a selection of phase controlling elements of said first R-C network;

a second R-C network responsive to said second signal for generating a fourth signal that is phase shifted with respect to said second signal, said third and fourth signals being coupled to said amplifier in a positive feedback manner such that a phase of said first signal with respect to that of each of said third and fourth signals is controlled in accordance with said gain of said amplifier; and means responsive to a reference signal for generating a gain control signal that is coupled to said amplifier for controlling said gain of said amplifier in accordance with cycles of said reference signal.

19. An oscillator according to claim 18 wherein said second R-C network is coupled to a second switching arrangement that varies, in accordance with a switch control signal, a selection of phase controlling elements of said second R-C network.

20. An oscillator according to claim 19 wherein each of said phase controlling elements of said R-C networks comprises a switched capacitor.

21. An oscillator according to claim 19 wherein said third and fourth signals are differentially symmetrical signals and wherein when the selection of elements varies in said first R-C network, the selection of elements varies also in said second R-C network in a manner to maintain said third and fourth signals differentially symmetrical.

* * * * *